(12) United States Patent
Kim et al.

(10) Patent No.: US 10,062,754 B2
(45) Date of Patent: Aug. 28, 2018

(54) SEMICONDUCTOR DEVICES AND METHODS OF FABRICATING THE SAME

(71) Applicant: Samsung Electronics Co., Ltd., Suwon-si (KR)

(72) Inventors: Jinbum Kim, Seoul (KR); Bonyoung Koo, Suwon-si (KR); Seokhoon Kim, Suwon-si (KR); Chul Kim, Seongnam-si (KR); Kwan Heum Lee, Suwon-si (KR); Byeongchan Lee, Yongin-si (KR); Sujin Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 63 days.

(21) Appl. No.: 14/491,117

(22) Filed: Sep. 19, 2014

(65) Prior Publication Data

US 2015/0214370 A1 Jul. 30, 2015

(30) Foreign Application Priority Data

Jan. 27, 2014 (KR) ........................ 10-2014-0009761

(51) Int. Cl.
*H01L 29/78* (2006.01)
*H01L 29/08* (2006.01)
*H01L 29/66* (2006.01)
*H01L 21/306* (2006.01)
*H01L 21/3065* (2006.01)
*H01L 29/165* (2006.01)

(52) U.S. Cl.
CPC ...... *H01L 29/0847* (2013.01); *H01L 21/3065* (2013.01); *H01L 21/30608* (2013.01); *H01L 29/66545* (2013.01); *H01L 29/66795* (2013.01); *H01L 29/785* (2013.01); *H01L 29/7848* (2013.01); *H01L 29/165* (2013.01)

(58) Field of Classification Search
CPC ......... H01L 29/66621; H01L 29/66636; H01L 29/7834; H01L 29/66795; H01L 29/785; H01L 29/41791; H01L 2029/78583; H01L 27/0886; H01L 27/0924; H01L 29/7848
USPC ....................................................... 257/401
See application file for complete search history.

(56) References Cited

U.S. PATENT DOCUMENTS

| 7,560,785 | B2 | 7/2009 | Yu et al. |
| 8,264,021 | B2 * | 9/2012 | Lai et al. ................. 257/288 |
| 2008/0124878 | A1 * | 5/2008 | Cook ............. H01L 29/66621 438/300 |
| 2011/0147842 | A1 * | 6/2011 | Cappellani ........ H01L 21/26506 257/365 |
| 2012/0091538 | A1 * | 4/2012 | Lin ................. H01L 29/66795 257/401 |
| 2012/0104472 | A1 * | 5/2012 | Xu ................... H01L 29/66795 257/288 |

(Continued)

*Primary Examiner* — David Spalla
(74) *Attorney, Agent, or Firm* — Ward and Smith, P.A.

(57) ABSTRACT

A semiconductor device includes a substrate provided with an active pattern; a gate structure provided on the active pattern to cross the active pattern; and source/drain regions provided at both sides of the gate structure. The active pattern includes a first region below the gate structure and second regions at both sides of the gate structure. A top surface of each of the second regions is lower than that of the first region. The source/drain regions are provided on the second regions, respectively, and each of the source/drain regions covers partially both sidewalls of each of the second regions.

17 Claims, 26 Drawing Sheets

(56) References Cited

U.S. PATENT DOCUMENTS

| | | | | |
|---|---|---|---|---|
| 2013/0200470 A1* | 8/2013 | Liu | ................... | H01L 29/66795 257/408 |
| 2013/0228875 A1* | 9/2013 | Lee | ................... | H01L 29/66795 257/401 |
| 2014/0335674 A1* | 11/2014 | Liao | ................. | H01L 29/66636 438/285 |
| 2015/0102411 A1* | 4/2015 | Ching | ............... | H01L 21/76205 257/347 |
| 2015/0206939 A1* | 7/2015 | Huang | .............. | H01L 29/66628 257/77 |

* cited by examiner

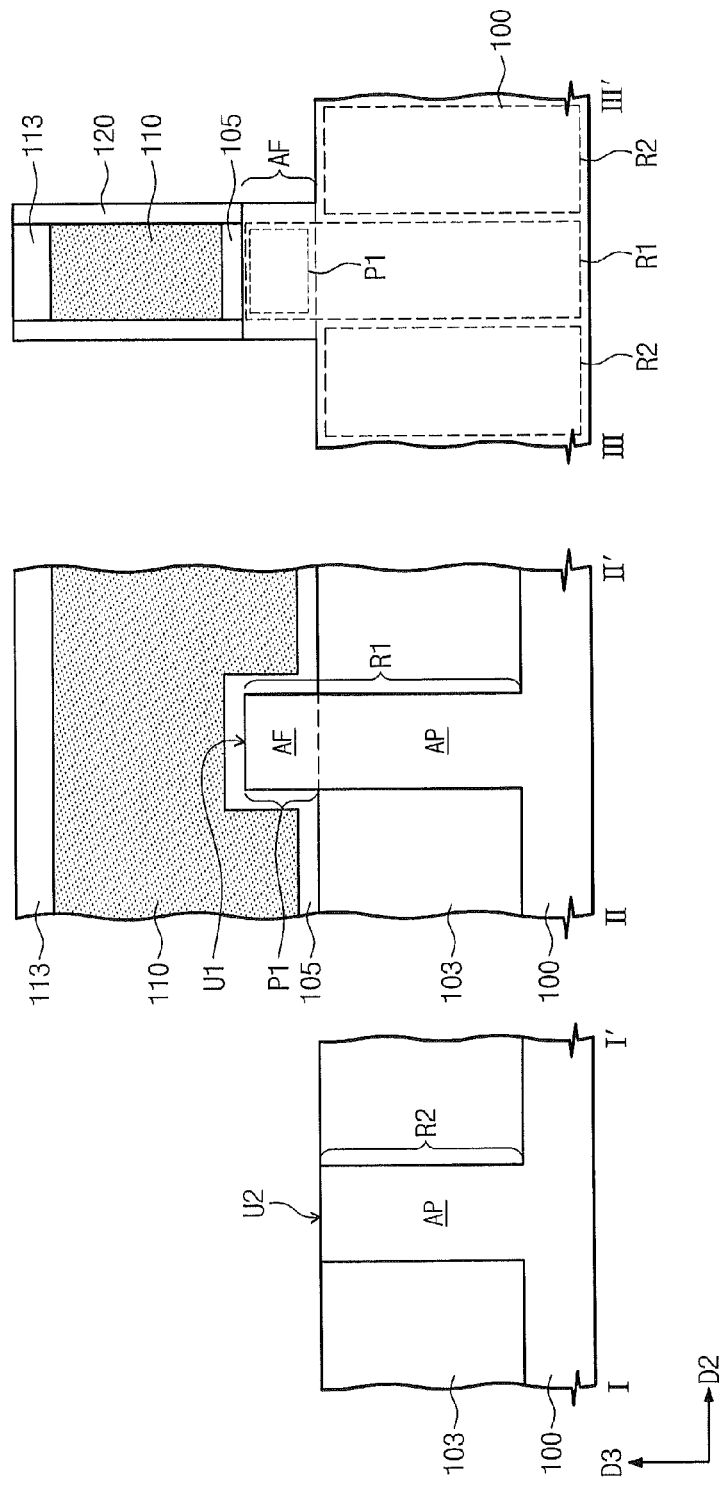

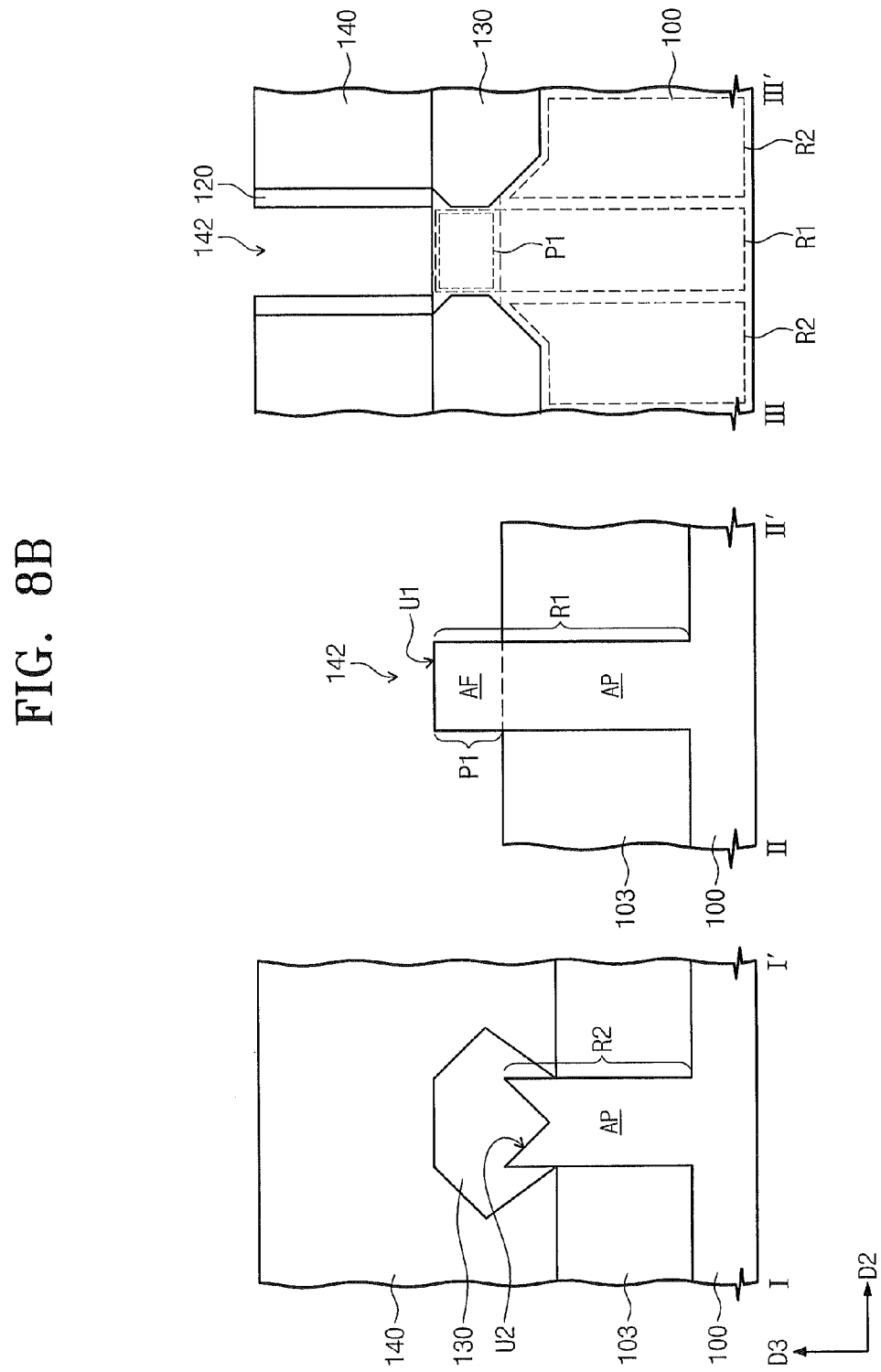

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2014-0009761, filed on Jan. 27, 2014, in the Korean Intellectual Property Office, the entire contents of which are hereby incorporated herein by reference.

FIELD

An example embodiment of the inventive concept relate to a semiconductor device and a method of fabricating the same, and in particular, to a fin field effect transistor and a method of fabricating the same.

BACKGROUND

A semiconductor device may include integrated circuits (ICs) consisting of metal-oxide-semiconductor field-effect transistors (MOS-FETs). As reduction in size and design rule of the semiconductor device is accelerated, the MOS-FETs are being scaled down increasingly. The reduction in size of the MOS-FET may lead to deterioration in operational properties of the semiconductor device. A variety of studies is conducted to overcome technical limitations associated with the scale-down of the semiconductor device and provide high performance semiconductor device.

SUMMARY

An example embodiment of the inventive concept provides a semiconductor device with an increased channel property and an increased resistance property and a method of fabricating the same.

According to an example embodiment of the inventive concept, a semiconductor device may include a substrate provided with an active pattern, a gate structure provided on the active pattern to cross the active pattern, and source/drain regions provided at both sides of the gate structure. The active pattern may include a first region disposed below the gate structure and second regions disposed at both sides of the gate structure, and a top surface of each of the second regions may be lower than that of the first region. The source/drain regions may be provided on the second regions, respectively, and each of the source/drain regions covers partially both sidewalls of each of the second regions.

In an example embodiment, the device may further include a device isolation pattern provided on the substrate to cover a portion of a sidewall of the active pattern. The device isolation pattern may include a third region disposed below the gate structure, and fourth regions disposed at both sides of the gate structure. A top surface of each of the fourth regions may be lower than that of the third region.

In an example embodiment, each of the second regions of the active pattern may have a sidewall exposed by the device isolation pattern, and each of the source/drain regions covers the sidewall of each of the second regions exposed by the device isolation pattern.

In an example embodiment, the top surface of each of the second regions may have a concave surface shape, when viewed in a sectional view.

In an example embodiment, the top surface of each of the second regions may have two opposite surfaces inclined in a symmetric manner, when viewed in a sectional view.

In an example embodiment, the substrate may include a single crystalline semiconductor material, and the top surface of each of the second regions may be a specific crystal plane of the single crystalline semiconductor material.

In an example embodiment, the substrate may be a single crystalline silicon wafer, and the top surface of each of the second regions may have a (111) plane of the single crystalline silicon wafer.

In an example embodiment, each of the source/drain regions may be an epitaxial pattern that is in contact with the top surface and the both sidewalls of each of the second regions.

In an example embodiment, the device may further include buffer patterns between the source/drain regions and the second regions, and each of the buffer patterns may be an epitaxial pattern that is in contact with the top surface and the both sidewalls of each of the second regions.

In an example embodiment, each of the source/drain regions and the buffer patterns may be formed of a germanium-containing material, and the buffer patterns may have a germanium concentration that may be lower than that of the source/drain regions.

According to another example embodiment of the inventive concept, a semiconductor device is provided. The semiconductor device includes a substrate, an active pattern protruding from the substrate in a direction substantially perpendicular to an upper surface of the substrate, and a gate structure provided on the substrate to cross the active pattern, wherein the active pattern comprises a first region disposed below the gate structure and second regions disposed at both sides of the gate structure, and a top surface of each of the second regions has a concave surface shape, when viewed in a sectional view.

In an example embodiment, the top surface of each of the second regions may have two opposite surfaces inclined in a symmetric manner, when viewed in a sectional view.

In an example embodiment, the substrate may be a single crystalline silicon wafer, and the top surface of each of the second regions may have a (111) plane of the single crystalline silicon wafer.

In an example embodiment, the device may further include a device isolation pattern provided on the substrate to cover a portion of a sidewall of the active pattern. The device isolation pattern may include a third region disposed below the gate structure, and fourth regions disposed at both sides of the gate structure. A top surface of each of the fourth regions may be lower than that of the third region.

In an example embodiment, the top surface of each of the second regions may be lower than a top surface of the first region.

In an example embodiment, the top surface of the first region may be higher than that of the third region.

In an example embodiment, each of the second regions of the active pattern may have a sidewall exposed by the device isolation pattern.

In an example embodiment, the device may further include source/drain regions provided on the second regions of the active pattern, respectively, and buffer patterns between the source/drain regions and the second regions. Each of the source/drain regions and the buffer patterns may be formed of a germanium-containing material, and the buffer patterns may have a germanium concentration that is lower than that of the source/drain regions.

According to still another example embodiment of the inventive concept, a semiconductor device is provided. The semiconductor device may include a substrate, an active pattern protruding from the substrate, the active pattern extending in a first direction parallel to the upper surface of the substrate, device isolations provided at both sides of the active pattern, the device isolations extending in the first direction, and a gate structure provided on the active pattern to extend a second direction parallel to the upper surface of the substrate and crossing the first direction. The active pattern may include a first region disposed below the gate structure and second regions disposed at both sides of the gate structure, and a top surface of each of the second regions is lower than that of the first region. Each of the device isolation patterns comprises a third region disposed below the gate structure and fourth regions disposed at both sides of the gate structure, and a top surface of each of the fourth regions may be lower than that of the third region.

In an example embodiment, the top surface of the first region may be higher than that of the third region, and each of the second regions of the active pattern may have both sidewalls exposed by the device isolation patterns.

According to an example embodiment of the inventive concept, a method of fabricating a semiconductor device may include patterning a substrate to form an active pattern, forming device isolation patterns at both sides of the active pattern, forming a sacrificial gate pattern on the substrate to cross the active pattern, and forming source/drain regions at both sides of the sacrificial gate pattern. The active pattern may include a first region below the sacrificial gate pattern and second regions at both sides of the sacrificial gate pattern, and the forming of the source/drain regions may include recessing upper portions of the second regions of the active pattern, and recessing upper portions of the device isolation patterns to expose both sidewalls of each of the second regions.

In an example embodiment, the substrate may include a single crystalline semiconductor material, the forming of the source/drain regions may further include etching upper portions of the recessed second regions using an etch recipe, which is selected in such a way that a specific crystal plane of the semiconductor material is etched in a lower etch rate than the other planes of the semiconductor material, and the etching of the upper portions of the recessed second regions may be performed in such a way that a top surface of each of the second regions has a concave surface shape, when viewed in a sectional view.

In an example embodiment, the etching of the upper portions of the recessed second regions may be performed to form a concave region in each of the upper portions of the second regions.

In an example embodiment, the etching of the upper portions of the recessed second regions may be performed by a wet etching process using $NH_4OH(l)$ or a dry etching process using $HCl(g)$.

In an example embodiment, the forming of the source/drain regions may further include performing a selective epitaxial growth process using the top surface of each of the second regions and the both sidewalls of each of the second regions exposed by the device isolation patterns as a seed layer.

In an example embodiment, the forming of the source/drain regions may further include forming buffer patterns to be in contact with the top surface of each of the second regions and the both sidewalls of each of the second regions exposed by the device isolation patterns, and performing a selective epitaxial growth process using the buffer patterns as a seed layer.

In an example embodiment, the forming of the buffer patterns may include performing a selective epitaxial growth process using the top surface of each of the second regions and the both sidewalls of each of the second regions exposed by the device isolation patterns as a seed layer.

BRIEF DESCRIPTION OF THE DRAWINGS

An example embodiment will be more clearly understood from the following brief description taken in conjunction with the accompanying drawings. The accompanying drawings represent non-limiting, an example embodiment as described herein.

FIGS. 2A through 8A are perspective views illustrating processing steps in the fabrication of a semiconductor device according to an example embodiment of the inventive concept.

FIGS. 2B through 8B are cross sectional views taken along I-I', II-II', and III-III' of FIGS. 2A through 8A, respectively.

Figure 1A:
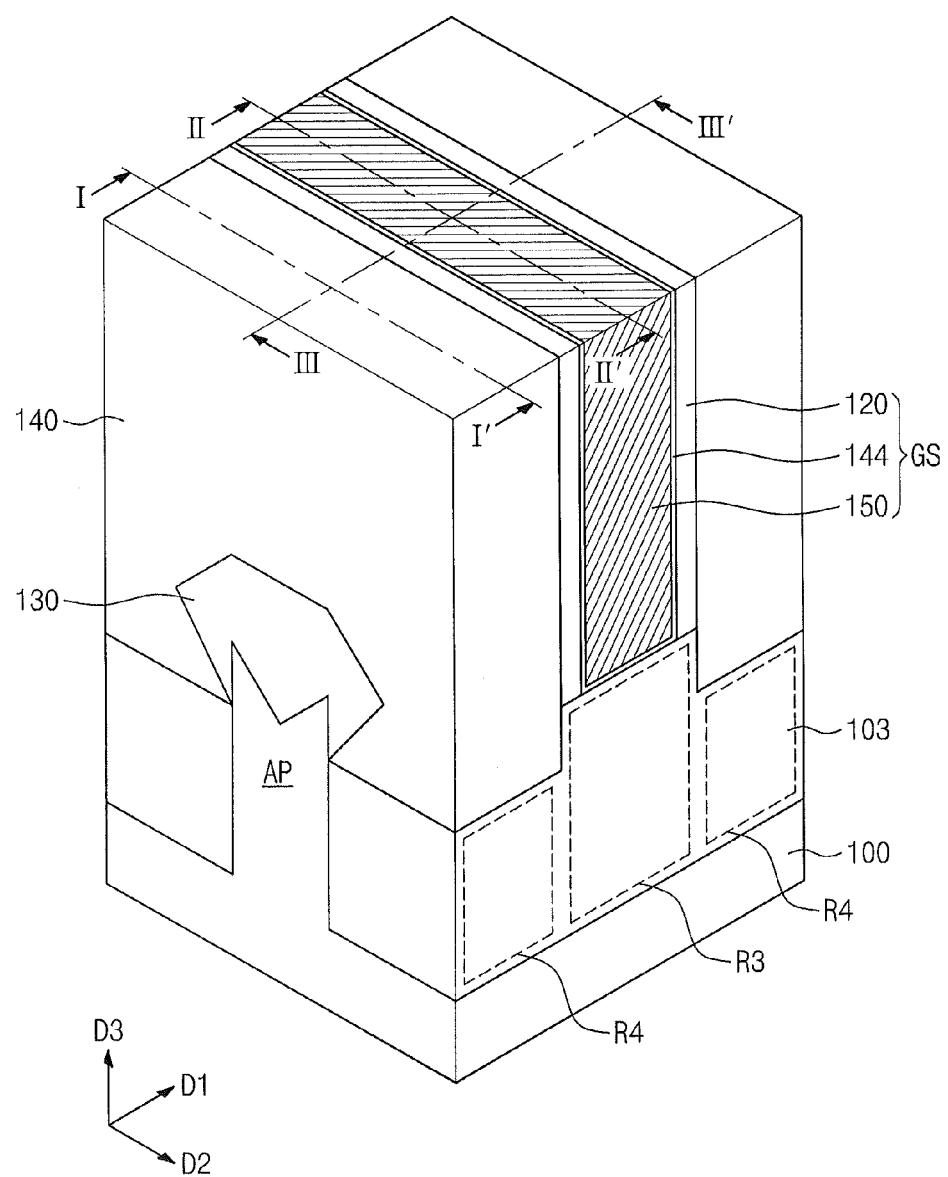
FIG. 1A is a perspective view illustrating a semiconductor device according to an example embodiment of the inventive concept.

It should be noted that these figures are intended to illustrate the general characteristics of methods, structure and/or materials utilized in certain an example embodiment and to supplement the written description provided below. These drawings are not, however, to scale and may not precisely reflect the precise structural or performance characteristics of any given embodiment, and should not be interpreted as defining or limiting the range of values or properties encompassed by an example embodiment. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

An example embodiment of the inventive concepts will now be described more fully with reference to the accompanying drawings, in which an example embodiment are shown. An example embodiment of the inventive concepts may, however, be embodied in many different forms and should not be construed as being limited to the embodiments set forth herein; rather, these embodiments are provided so that this disclosure will be thorough and complete, and will fully convey the concept of an example embodiment to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of an example embodiment.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of an example embodiment. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which an example embodiment of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
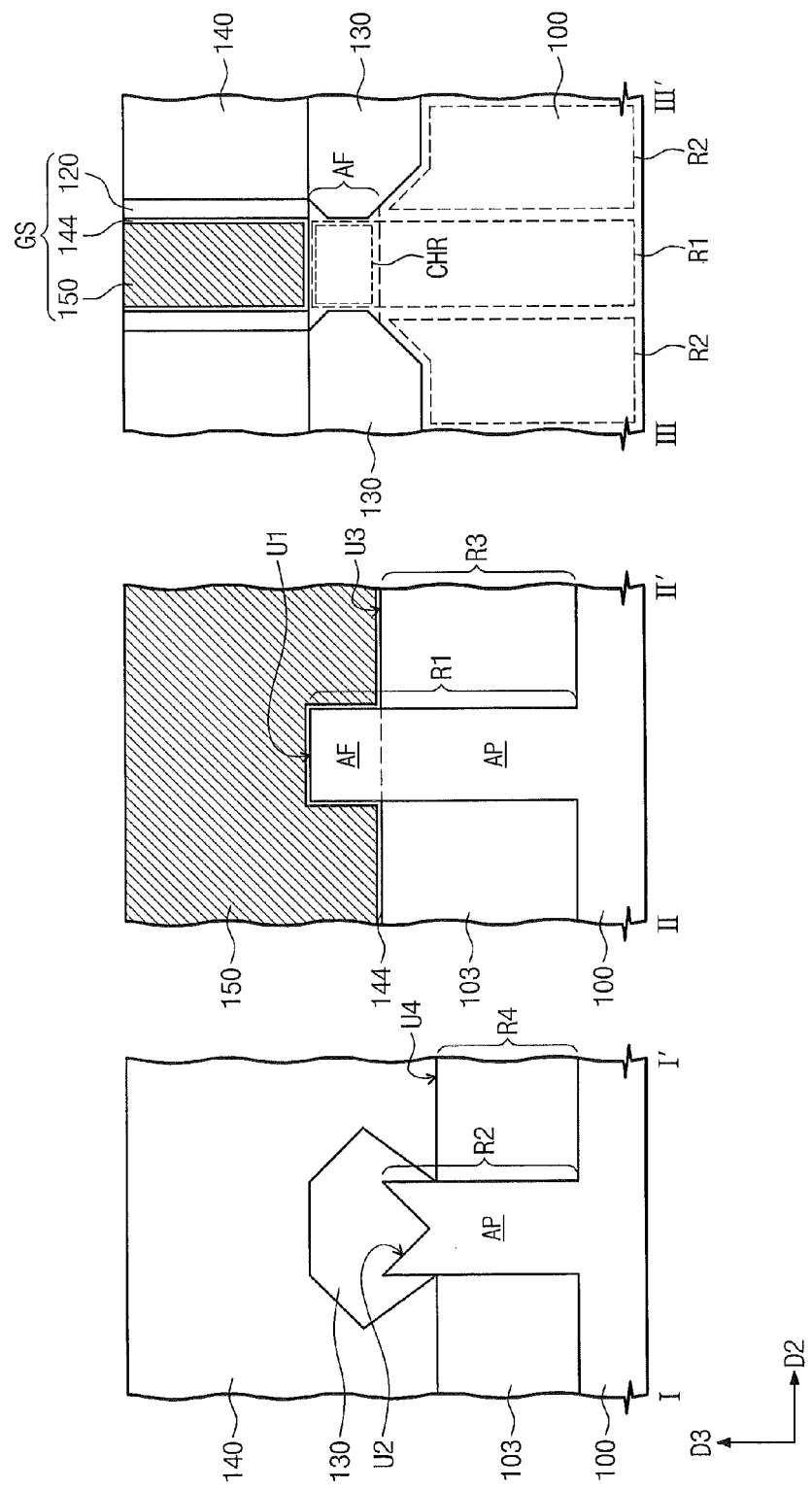
FIG. 1B shows cross sectional views taken along lines and I-I', II-II', and III-III' of FIG. 1A.

FIG. 1A is a perspective view illustrating a semiconductor device according to an example embodiment of the inventive concept, and FIG. 1B shows sectional views taken along lines I-I', II-II', and III-III' of FIG. 1A.

Referring to FIGS. 1A and 1B, an active pattern AP may be provided on a substrate 100. The substrate 100 may be a semiconductor substrate. For example, the substrate 100 may be a bulk silicon wafer or a silicon on insulator (SOI) wafer. The active pattern AP may extend along a first direction D1. The active pattern AP may have a shape protruding upward from the substrate 100. In other words, the active pattern AP may protrude from the substrate 100 toward a third direction D3 that is perpendicular to both of the first direction D1 and a second direction D2 crossing the first direction D1. Device isolation patterns 103 may be provided at both sides of the active pattern AP. The device isolation patterns 103 may include oxide, nitride, and/or oxynitride. The device isolation patterns 103 may extend along the first direction D1 and may be spaced apart from each other in the second direction D2 with the active pattern AP interposed therebetween. Each of the device isolation patterns 103 may cover a portion of a sidewall of the active pattern AP. For example, the active pattern AP may include an upper portion exposed by the device isolation patterns 103.

A gate structure GS may be disposed on the substrate 100 to cross the active pattern AP. The gate structure GS may cover partially both sidewalls of the active pattern AP. The active pattern AP may include a first region R1 below the gate structure GS and second regions R2 on both sides of the gate structure GS. A top surface U2 of each of the second regions R2 of the active pattern AP may be lower than a top surface U1 of the first region R1 of the active pattern AP.

When viewed in a sectional view, the top surface U2 of each of the second regions R2 may have a concave surface shape. For example, when viewed in the sectional view, the top surface U2 of each of the second regions R2 may have two opposite surfaces inclined in a symmetric manner. In an example embodiment, the substrate 100 may include a single crystalline semiconductor material, and the top surface U2 of each of the second regions R2 may be a specific crystal plane of the single crystalline semiconductor material. For example, the substrate 100 may be formed of single crystalline silicon, and the top surface U2 of each of the second regions R2 may be a (111) plane of the single crystalline silicon structure.

Each of the device isolation patterns 103 may include a third region R3 positioned below the gate structure GS and fourth regions R4 positioned at both sides of the gate structure GS. A top surface U4 of each of the fourth regions R4 may be lower than a top surface U3 of the third region R3. Hereinafter, an upper portion of the first region R1 of the active pattern AP exposed by the device isolation patterns 103 will be referred to as an "active fin AF". The active fin AF may include a channel region CHR. An upper portion of each of the second regions R2 of the active pattern AP may also be exposed by the device isolation patterns 103. In other words, each of the second regions R2 of the active pattern AP may have sidewalls exposed by the device isolation patterns 103.

Source/drain regions 130 may be provided at both sides of the gate structure GS. The source/drain regions 130 may be provided on the second regions R2, respectively, of the active pattern AP. Each of the source/drain regions 130 may cover the top surface U2 of each of the second regions R2 and may cover the sidewalls of each of the second regions R2 exposed by the device isolation patterns 103. Each of the source/drain regions 130 may be an epitaxial pattern that is in contact with the top surface U2 of each of the second regions R2 and the sidewalls of each of the second regions R2 exposed by the device isolation patterns 103. Each of the source/drain regions 130 may include an epitaxial pattern, which is grown from the substrate 100 and is formed of at least one of silicon germanium (SiGe), silicon (Si), or silicon carbide (SiC).

The active fin AF may have a top surface higher than bottom surfaces of the source/drain regions 130 in terms of vertical position and may be positioned between the source/drain regions 130 in terms of horizontal position.

A lower interlayer insulating layer 140 may be provided on the substrate 100 to cover the source/drain regions 130 and both sidewalls of the gate structure GS. The lower interlayer insulating layer 140 may include at least one of a silicon oxide layer, a silicon nitride layer, a silicon oxynitride layer, or low-k dielectrics. The gate structure GS may include a gate electrode 150, a gate spacer 120 between the gate electrode 150 and the lower interlayer insulating layer 140, and a gate dielectric pattern 144 between the gate electrode 150 and the gate spacer 120. The gate dielectric pattern 144 may be provided between the gate electrode 150 and the active fin AF and may extend laterally from the active fin AF to cover at least a portion of the top surface of each of the device isolation patterns 103. In an example embodiment, the top surface of each of the device isolation patterns 103 may include portions that are not covered by the gate dielectric pattern 144. The top surfaces of the device isolation patterns 103 that are not covered by the gate dielectric pattern 144 may be covered with the lower interlayer insulating layer 140. The gate dielectric pattern 144 may extend along the bottom surface of the gate electrode 150.

The gate electrode 150 may include at least one of conductive metal nitrides (e.g., titanium nitride, tantalum nitride, and so forth) or metals (e.g., aluminum, tungsten, and so forth). The gate spacer 120 may include nitride (e.g., silicon nitride). The gate dielectric pattern 144 may include at least one of high-k dielectrics. For example, the gate dielectric pattern 144 may include at least one of hafnium oxide, hafnium silicate, zirconium oxide, or zirconium silicate, but an example embodiment of the inventive concept may not be limited to the materials.

Although not shown, an upper interlayer insulating layer may be provided on the substrate 100 provided with the gate structure GS. The upper interlayer insulating layer may include oxide, nitride, and/or oxynitride. Contact holes may be formed through the upper interlayer insulating layer and the lower interlayer insulating layer 140 to expose the source/drain regions 130, and contact plugs may be provided in the contact holes, respectively. Interconnection lines may be provided on the upper interlayer insulating layer and may be connected to the contact plugs. The interconnection lines may be connected to the source/drain regions 130 through the contact plugs. The contact plugs and the interconnection lines may include a conductive material.

Figure 12:
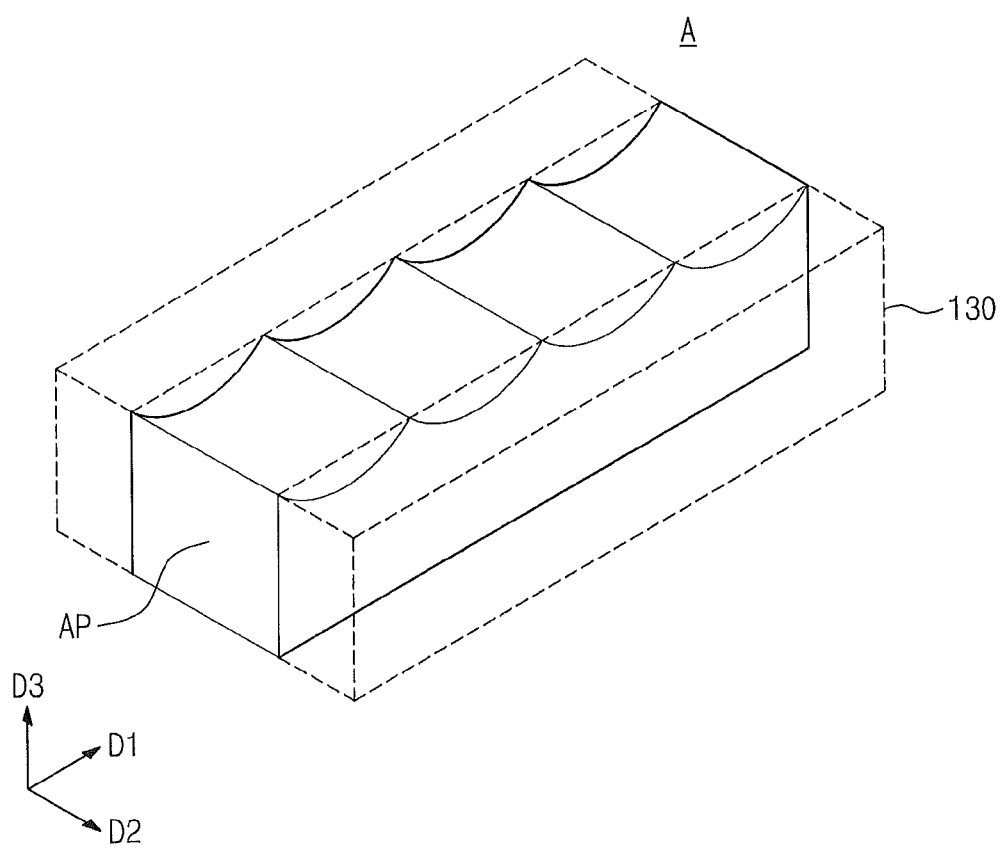
FIG. 12 is an enlarged perspective view illustrating a portion A of FIG. 4A.
Figure 13:
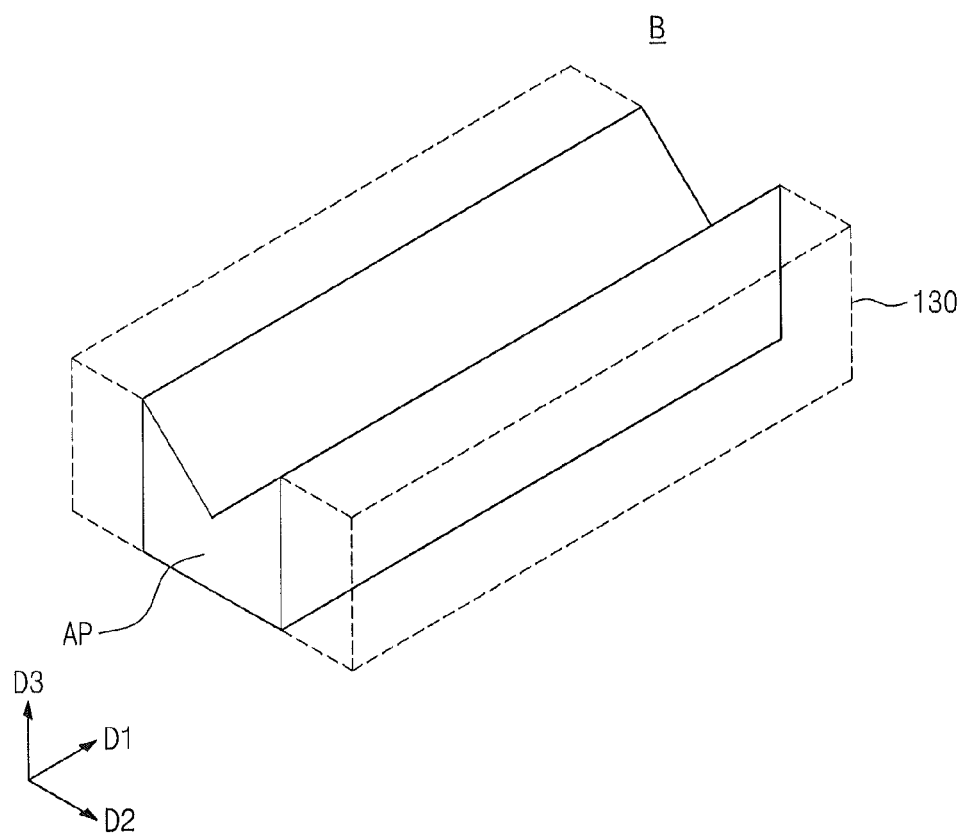
FIG. 13 is an enlarged perspective view illustrating a portion B of FIG. 5A.
Figure 14:
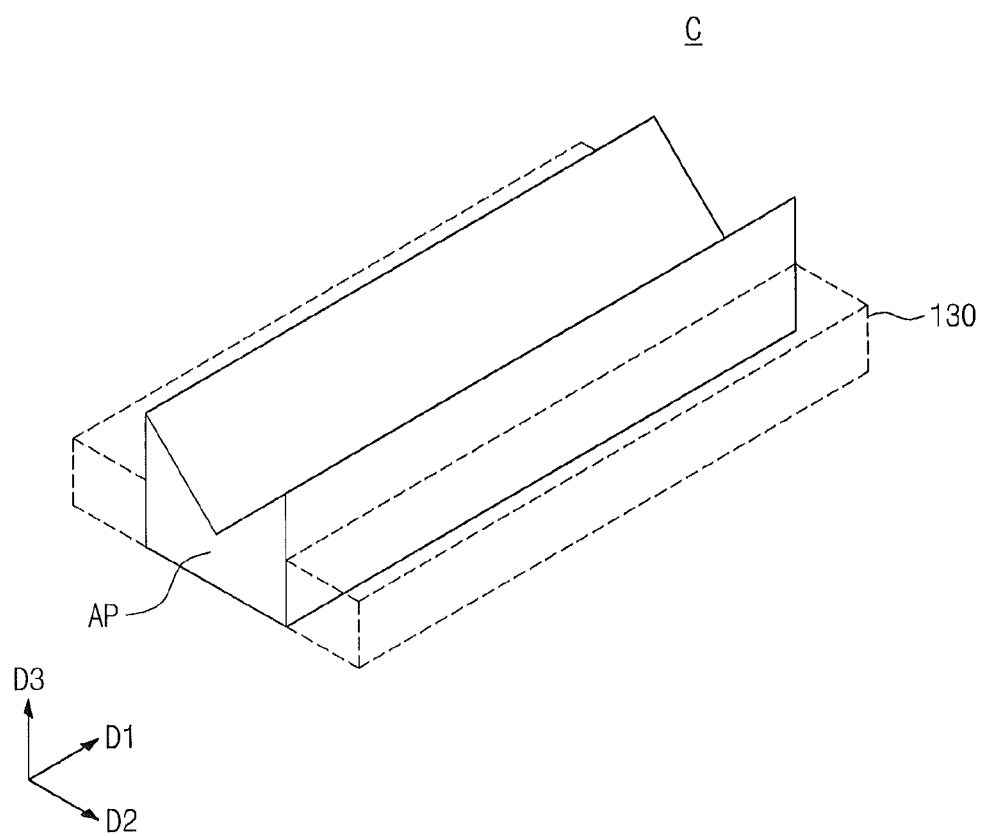
FIG. 14 is an enlarged perspective view illustrating a portion C of FIG. 6A.

FIGS. 2A through 8A are perspective views illustrating a method of fabricating a semiconductor device according to an example embodiment of the inventive concept, and FIGS. 2B through 8B are sectional views taken along I-I', II-II', and III-III' of FIGS. 2A through 8A, respectively. FIGS. 12 through 14 are enlarged perspective views of portions A, B, and C that are shown in FIGS. 4A, 5A, and 6A, respectively.

Figure 2A:
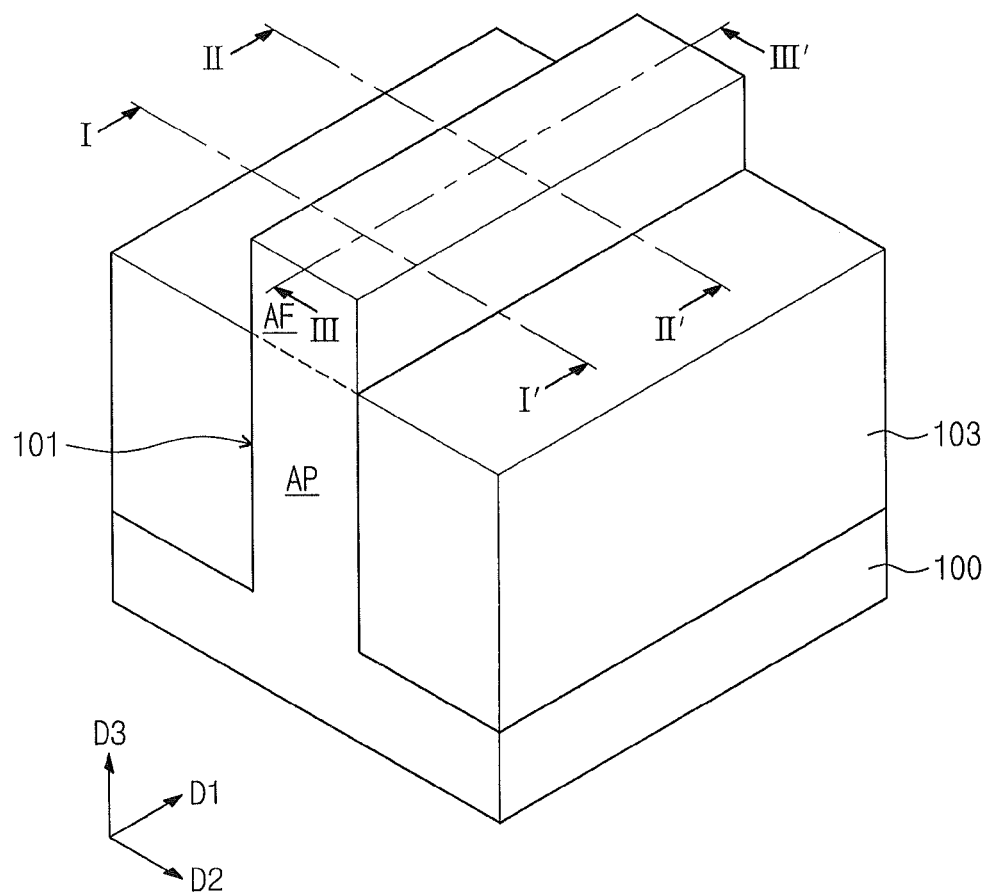
Figure 2B:
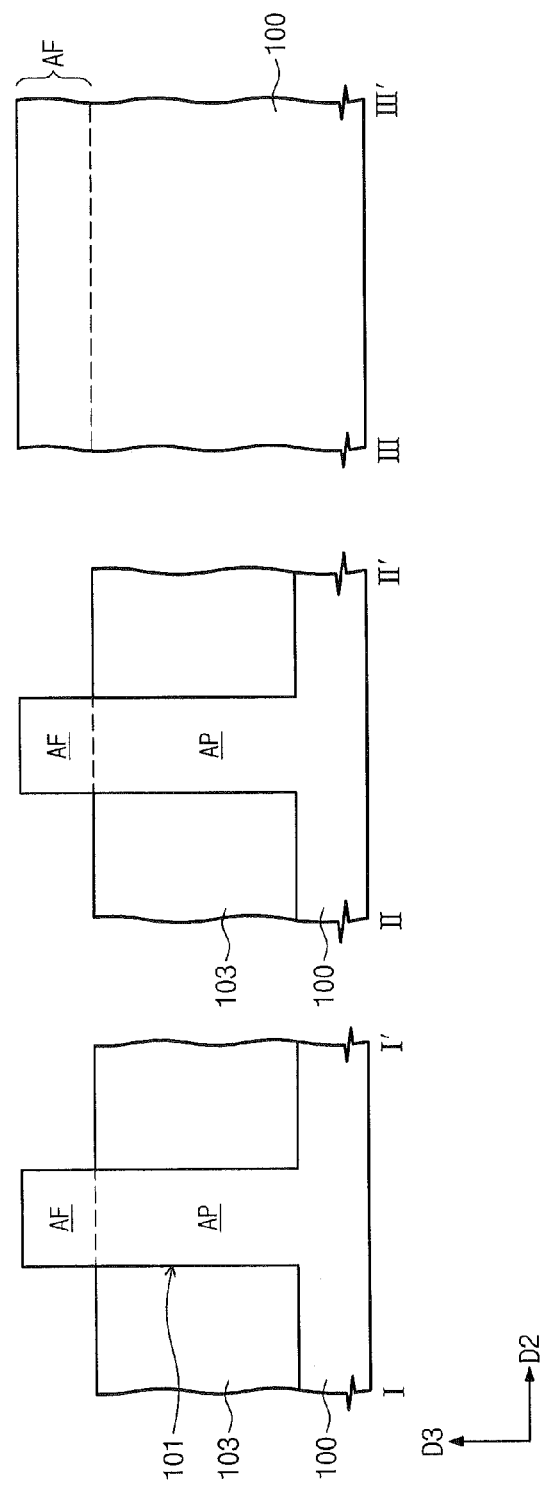

Referring to FIGS. 2A and 2B, a substrate 100 may be patterned to form trenches 101 defining an active pattern AP. The substrate 100 may be a bulk silicon wafer or an SOI wafer. The trenches 101 may extend parallel to a first direction D1, and the trenches 101 may be spaced apart from each other in a second direction D2 crossing the first direction D1. Accordingly, the active pattern AP may be formed to have a shape extending along the first direction D1.

The formation of the trenches 101 may include forming mask patterns on the substrate 100, and then, anisotropically etching the substrate 100 using the mask patterns as etch masks. Although not shown, in some embodiments, each of the trenches 101 may be formed to have a width decreasing in downward direction, and thus, the active pattern AP may be formed to have a width decreasing in upward direction.

Device isolation patterns 103 may be formed to fill the trenches 101. The formation of the device isolation patterns 103 may include forming a device isolation layer on the substrate 100 to fill the trenches 101, and then, performing a planarization process to the device isolation layer to expose the mask pattern.

Thereafter, an upper portion of the active pattern AP may be exposed. The upper portion of the active pattern AP may be exposed by recessing upper portions of the device isolation patterns 103. The recessing of the upper portions of the device isolation patterns 103 may be performed by, for example, a wet etching process using an etching recipe having an etch selectivity with respect to the active pattern AP. In the present specification, the upper portion of the active pattern AP exposed by the device isolation patterns 103 will be referred to as an "active fin AF". During the recessing of the upper portions of the device isolation patterns 103, the mask patterns may be removed to expose a top surface of the active fin AF.

Figure 3A:
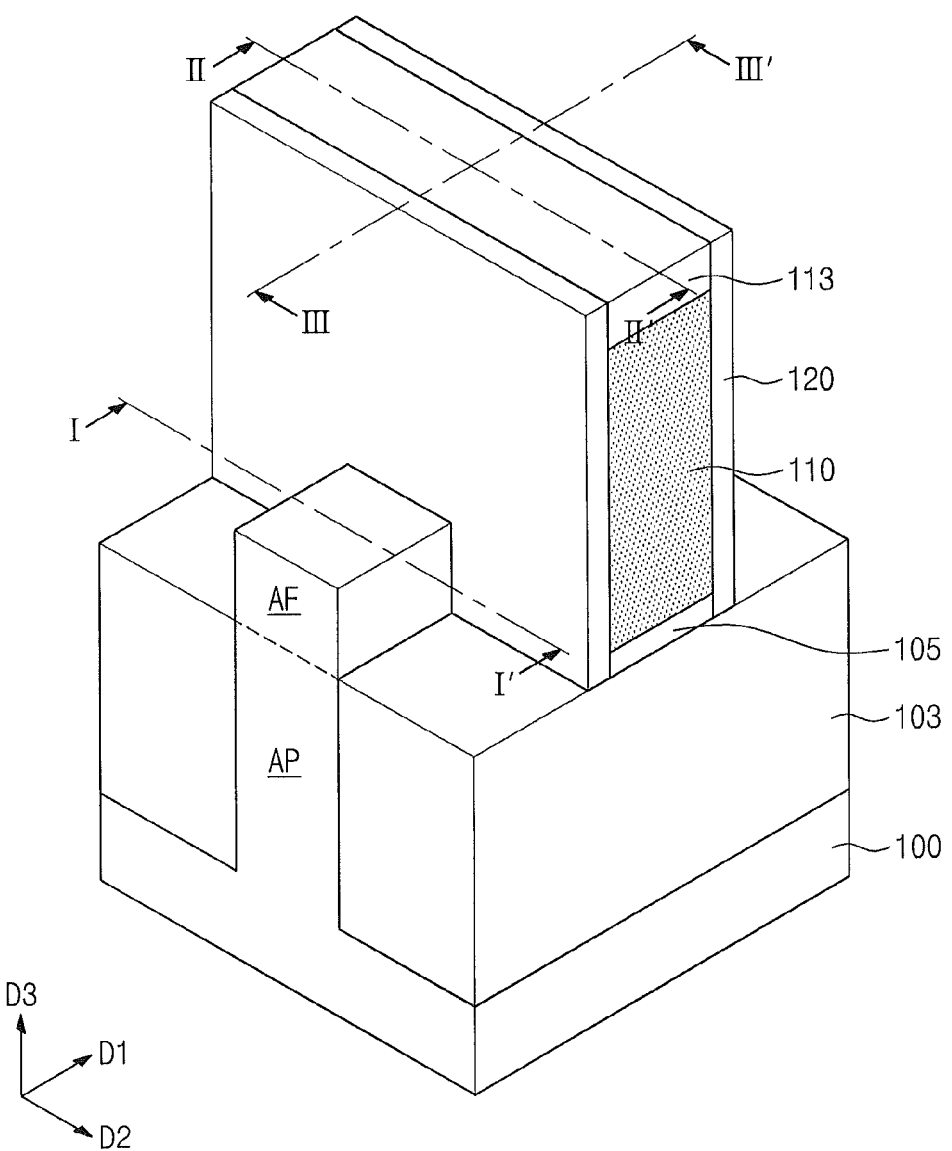
Figure 3B:
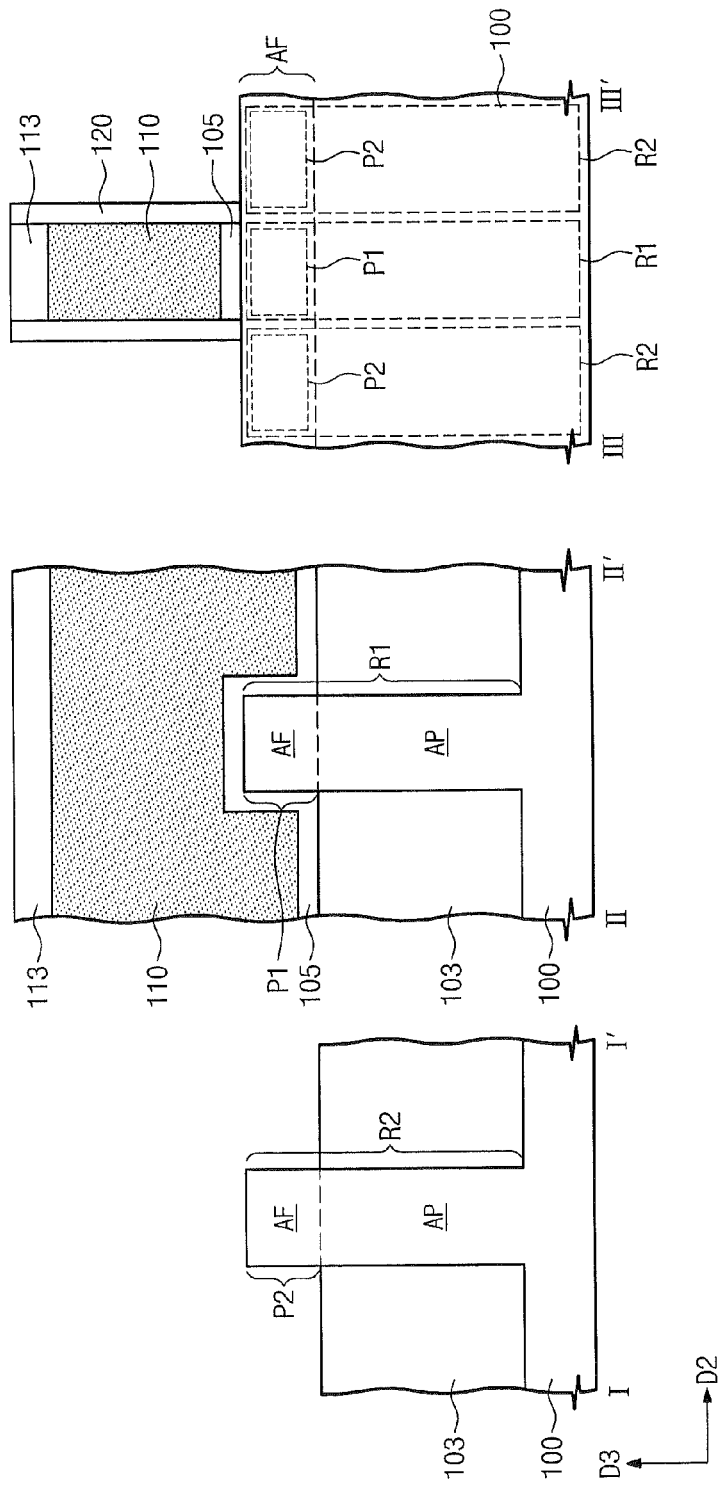

Referring to FIGS. 3A and 3B, an etch stop layer and a sacrificial gate layer may be sequentially formed on the substrate 100 to cover the active fin AF. The etch stop layer may include, for example, a silicon oxide layer. The sacrificial gate layer may include a material having an etch selectivity with respect to the etch stop layer. The sacrificial gate layer may include, for example, a poly silicon layer.

The sacrificial gate layer may be patterned to form a sacrificial gate pattern 110 on the substrate 100, and the sacrificial gate pattern 110 may be formed to cross the active fin AF. The formation of the sacrificial gate pattern 110 may include forming a gate mask pattern 113 on the sacrificial gate layer, and etching the sacrificial gate layer using the gate mask pattern 113 as an etch mask. The gate mask pattern 113 may include, for example, a silicon nitride layer. The etching of the sacrificial gate layer may be performed using an etching recipe having an etch selectivity with respect to the etch stop layer.

The active fin AF may include a first portion P1 and second portions P2, which are defined by the sacrificial gate pattern 110 crossing the active fin AF. The first portion P1 may be a portion of the active fin AF that is positioned below the sacrificial gate pattern 110 and is overlapped with the sacrificial gate pattern 110. The second portions P2 may be two portions of the active fin AF that are positioned at both sides of the sacrificial gate pattern 110 and are horizontally separated by the first portion P1.

In addition, since the sacrificial gate pattern 110 is formed to cross the active fin AF, a first region R1 and second regions R2 may be defined in the active pattern AP. The first region R1 may be a portion of the active pattern AP that is positioned below the sacrificial gate pattern 110 and is overlapped with the sacrificial gate pattern 110. The second regions R2 may be two portions of the active pattern AP that are positioned at both sides of the sacrificial gate pattern 110 and are horizontally separated from each other by the first region R1.

The first portion P1 of the active fin AF may be an upper portion of the first region R1 of the active pattern AP, and the second portions P2 of the active fin AF may be upper portions of the second regions R2, respectively, of the active pattern AP.

After the formation of the sacrificial gate pattern 110, the etch stop layer may be removed from both sides of the sacrificial gate pattern 110 to form an etch stop pattern 105 below the sacrificial gate pattern 110. The etch stop pattern 105 may extend along a bottom surface of the sacrificial gate pattern 110 to cover top and side surfaces of the first portion P1 of the active fin AF and top surfaces of the device isolation patterns 103.

A gate spacer 120 may be formed on both sidewalls of the sacrificial gate pattern 110. The gate spacer 120 may include, for example, a silicon nitride layer. The formation of the gate spacer 120 may include forming a gate spacer layer (not shown) on the substrate 100 provided with the sacrificial gate pattern 110, and anisotropically etching the gate spacer layer. As the result of the anisotropic etching process, the top surfaces of the second portions P2 of the active fin AF and the top surfaces of the device isolation patterns 103 may be exposed. Further, the etching process may be performed to expose sidewalls of the second portions P2 of the active fin AF. In addition, a portion of the gate mask pattern 113 may be etched during the etching process. In certain embodiments, after the etching process, the gate mask pattern 113 may partially remain on the sacrificial gate pattern 110.

Figure 4A:
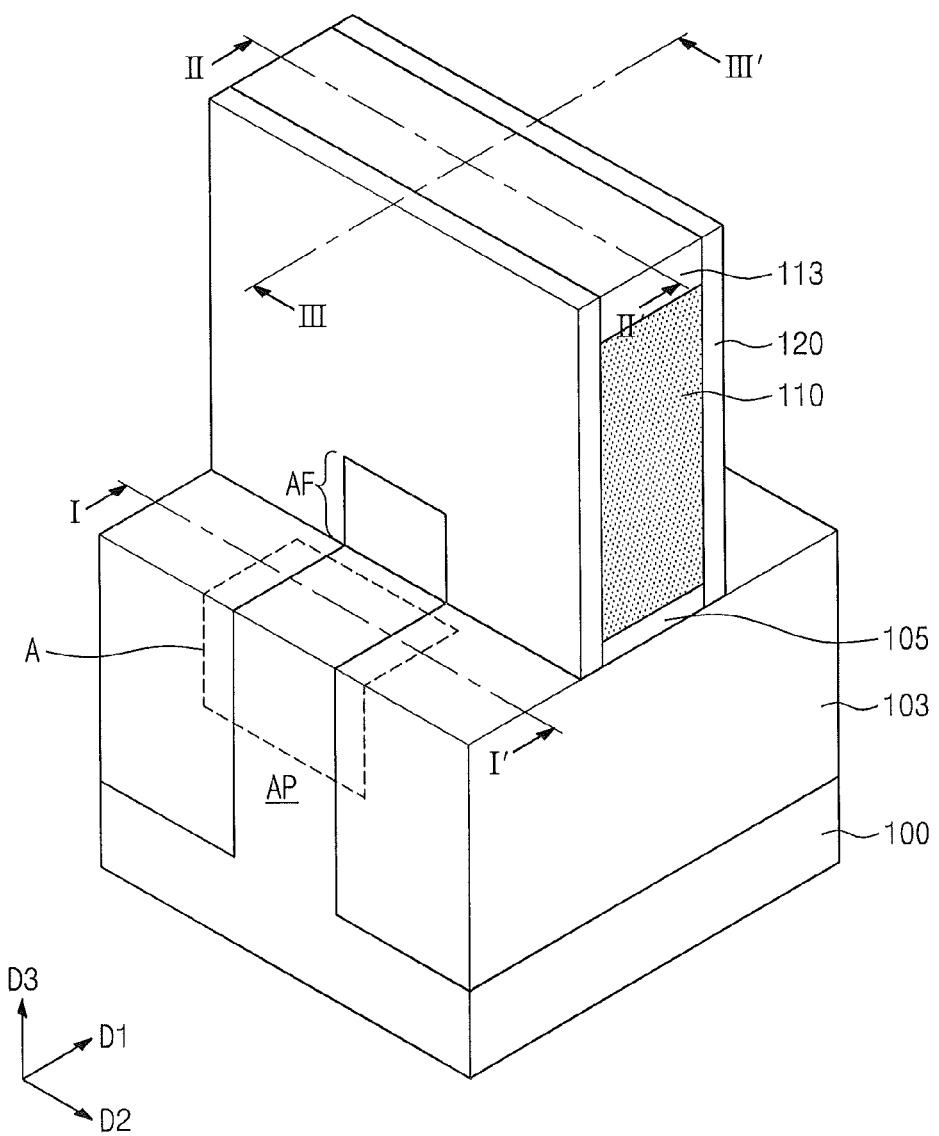

Referring to FIGS. 4A, 4B, and 12, the second portions P2 of the active fin AF may be removed. Accordingly, a top surface U2 of each of the second regions R2 of the active pattern AP may be lower than a top surface U1 of the first region R1 of the active pattern AP. The removing of the second portions P2 of the active fin AF may be performed using a dry or wet etching process. By the etching process, the top surface U2 of each of the second regions R2 of the active pattern AP has a height varying along the first direction D1, as shown in FIG. 12. For example, in the first direction D1, there may be a large variation in height of the top surface U2 of each of the second regions R2.

Figure 5A:
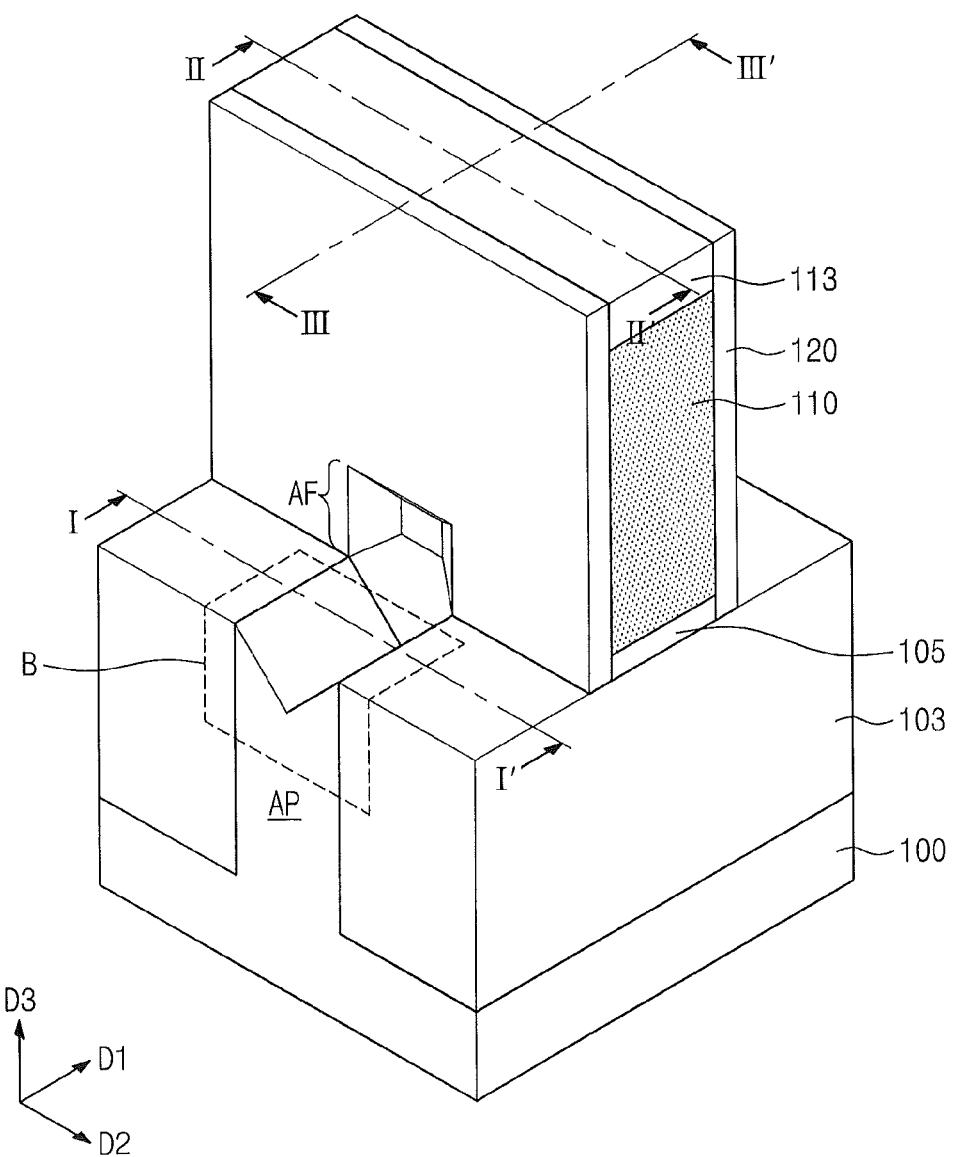
Figure 5B:
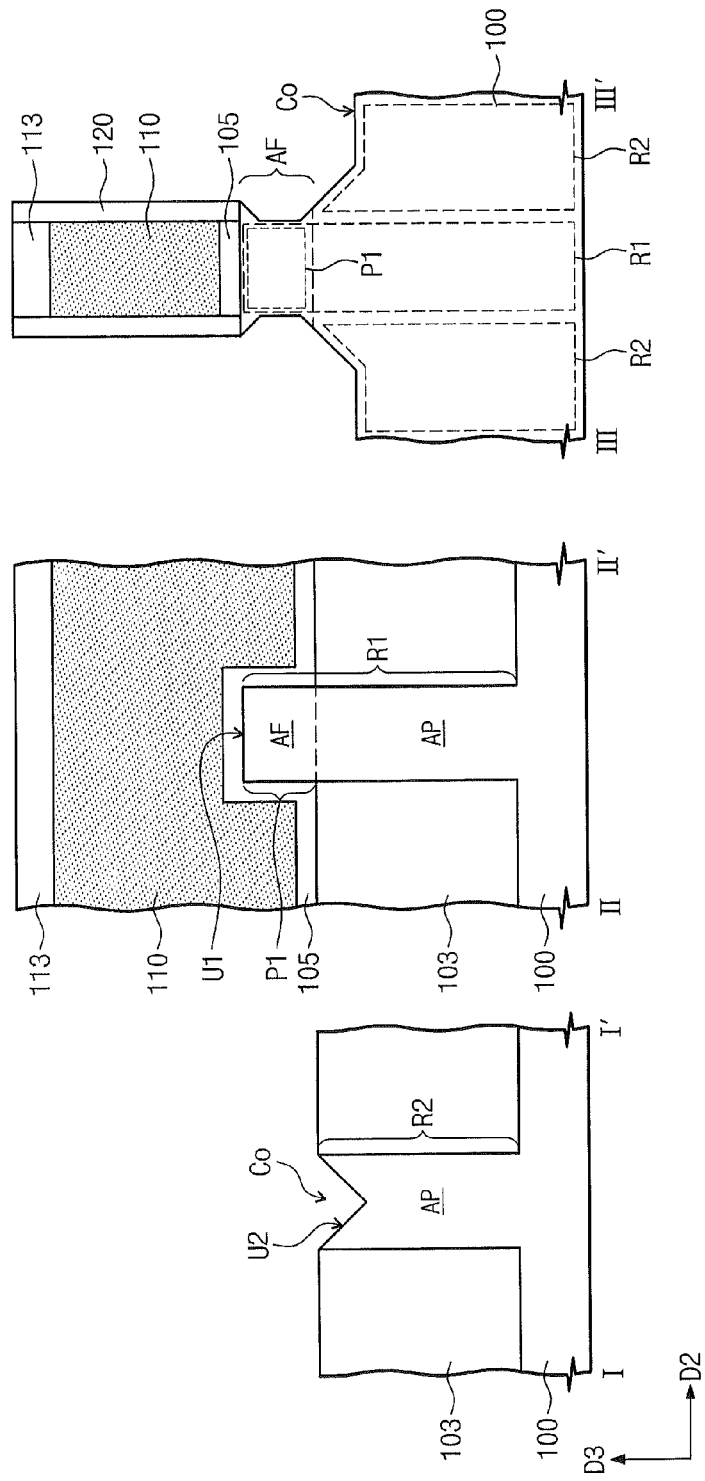

Referring to FIGS. 5A, 5B, and 13, after the removal of the second portions P2 of the active fin AF, the upper portion of each of the second regions R2 of the active pattern AP may be etched to form a concave region Co. For example, when viewed in a sectional view, the top surface U2 of each of the second regions R2 may be formed to have a concave surface shape.

The substrate 100 may include a single crystalline semiconductor material. In this case, the formation of the concave region Co may include etching the upper portion of each of the second regions R2 of the active pattern AP using an anisotropic etching method, in which etch rate is dependent on the crystal direction of the semiconductor material constituting the substrate 100. For example, in the case where the substrate 100 is a single crystalline silicon wafer, the etching process may be performed using an etch recipe, which is selected in such a way that the (111) plane of the single crystalline silicon structure is etched in a lower etch rate than the other planes of the single crystalline silicon structure. For example, the etching process may be performed by a wet etching process using $NH_4OH(l)$ or a dry etching process using $HCl(g)$.

Depending on the etching property of the etching process, the top surface U2 of each of the second regions R2 may have two opposite surfaces inclined in a symmetric manner, when viewed in the sectional view. In other words, the concave region Co may be defined by two opposite surfaces inclined in a symmetric manner.

The top surface U2 of each of the second regions R2 may be a specific crystal plane of the single crystalline semiconductor material, depending on the etching recipe of the etching process. For example, the substrate 100 may be formed of single crystalline silicon, and the top surface U2 of each of the second regions R2 may be a (111) plane of the single crystalline silicon structure.

Further, as shown in FIG. 13, depending on the etching property of the etching process, the top surface U2 of each of the second regions R2 may have a uniform height, when measured along the first direction D1. In other words, it is possible to reduce a variation in height of the top surface U2 of each of the second regions R2, when measured along the first direction D1.

In an example embodiment, the sidewall of the first portion P1 of the active fin AF may be partially etched during the etching process.

Figure 6A:
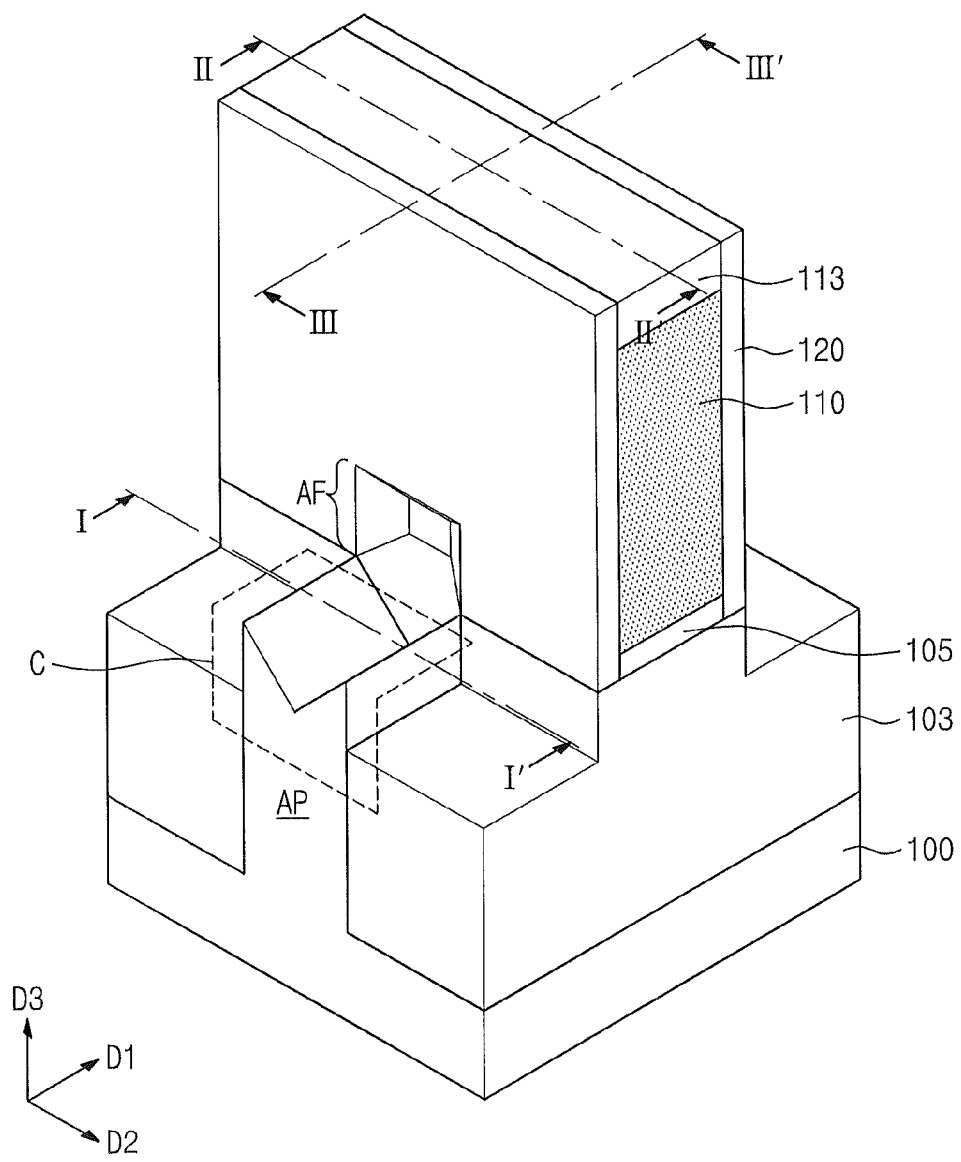
Figure 6B:
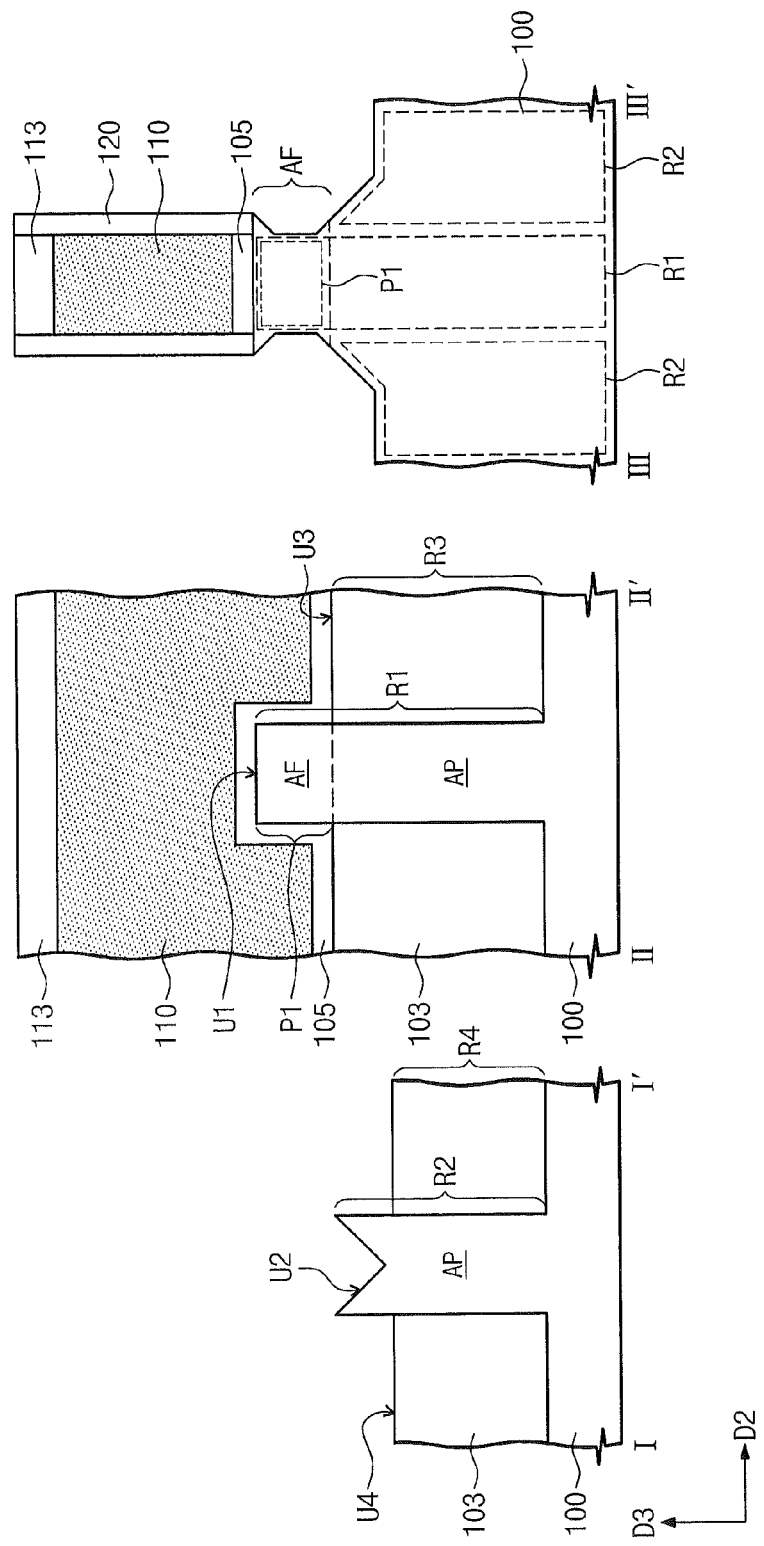

Referring to FIGS. 6A, 6B, and 14, the upper portions of the device isolation patterns 103 may be recessed to partially expose both sidewalls of each of the second regions R2 of the active pattern AP. For example, each of the device isolation patterns 103 may include a third region R3 below the sacrificial gate pattern 110 and fourth regions R4 at both sides of the sacrificial gate pattern 110. The recessing of the upper portion of the device isolation patterns 103 may include etching the upper portions of the fourth regions R4. As the result of the recessing process, a top surface U4 of each of the fourth regions R4 may be lowered that a top surface U3 of the third region R3.

Figure 7A:
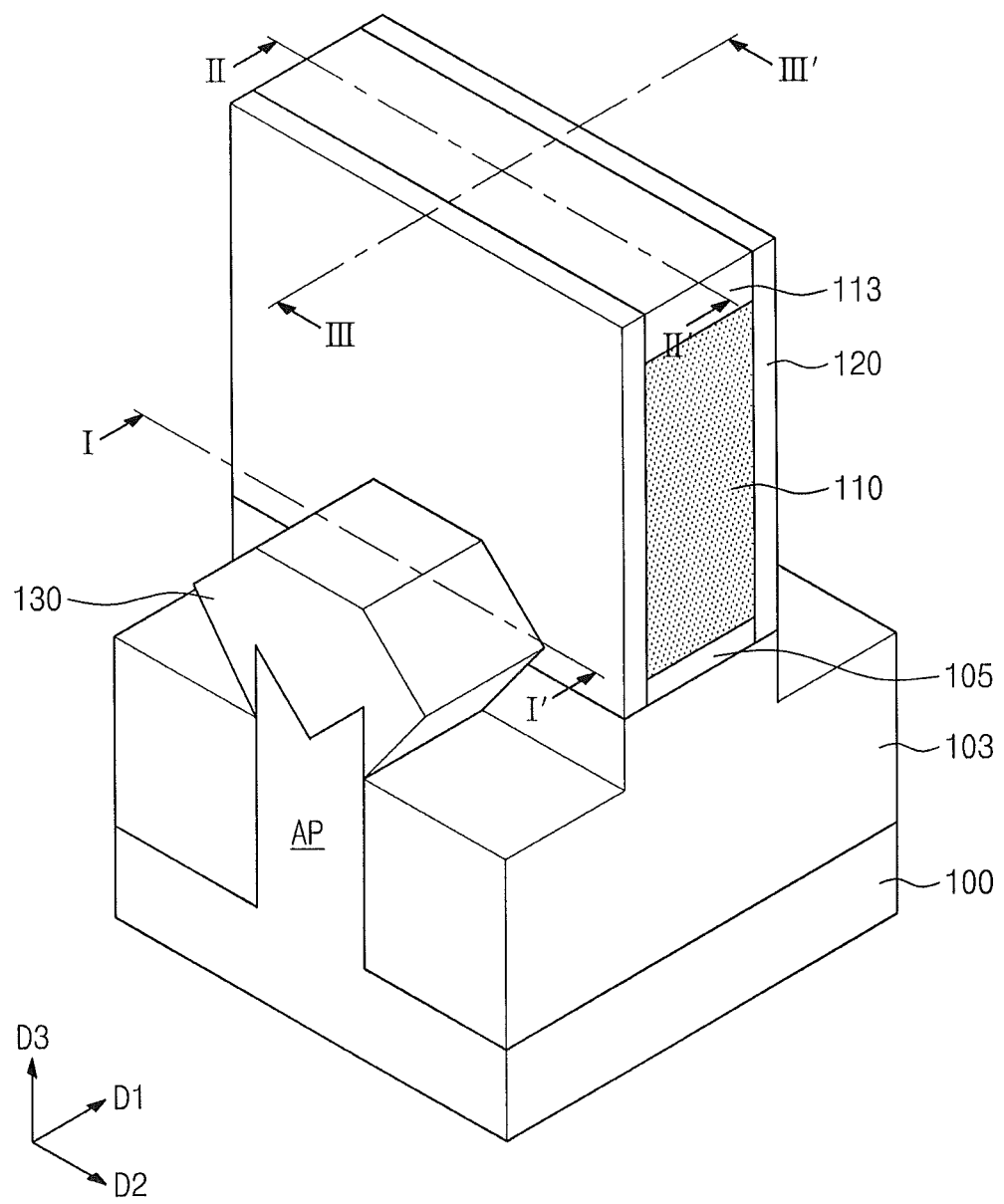
Figure 7B:
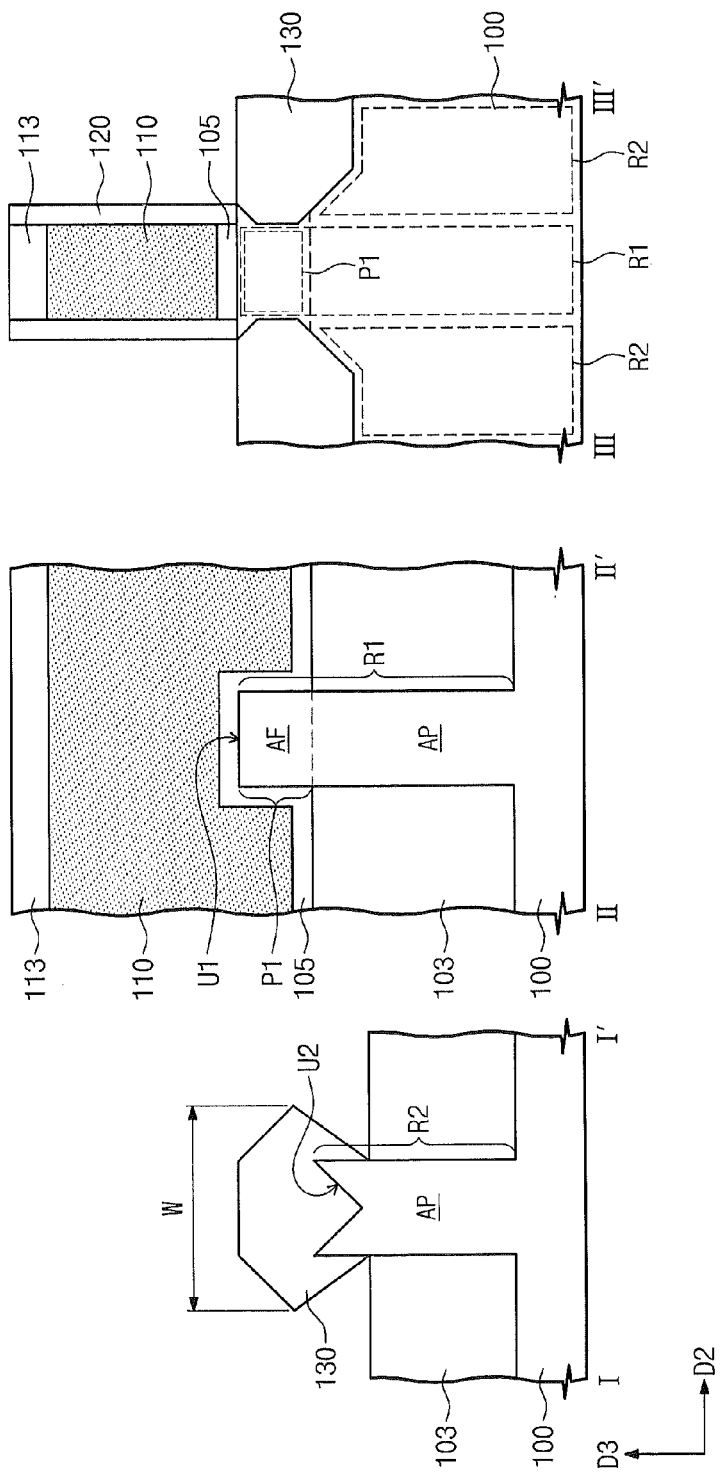

Referring to FIGS. 7A and 7B, source/drain regions 130 may be formed at both sides of the sacrificial gate pattern 110. The source/drain regions 130 may be formed on the second regions R2, respectively, of the active pattern AP. Each of the source/drain regions 130 may cover the top surface U2 of each of the second regions R2 of the active pattern AP and may extend along the both sidewalls of each of the second regions R2 to partially cover the both sidewalls of each of the second regions R2.

The formation of the source/drain regions 130 may include performing a selective epitaxial growth process to the substrate 100. For example, each of the source/drain regions 130 may be an epitaxial pattern, which may be grown using the top surface U2 and the both sidewalls of each of the second regions R2 of the active pattern AP as a seed layer. Each of the source/drain regions 130 may include an epitaxial pattern, which is grown from the substrate 100 and is formed of, for example, at least one of silicon germanium (SiGe), silicon (Si), or silicon carbide (SiC). For example, in the case where the semiconductor device is a CMOS type device, a first epitaxial layer for source/drain regions of NMOSFET and a second epitaxial layer for source/drain regions of PMOSFET may be formed. The first epitaxial layer may be formed to cause a tensile strain, and the second epitaxial layer may be formed to cause a compressive strain. For example, the first and second epitaxial layers may be formed of silicon carbide (SiC) and silicon germanium (SiGe), respectively, but an example embodiment of the inventive concept may not be limited thereto.

During or after the epitaxial process, the source/drain regions 130 may be doped with impurities.

In general, an increase in height variation of the top surface U2 of each of the second regions R2 may lead to an increase in height variation of the source/drain regions 130, which are epitaxially grown using the top surface U2 of each of the second regions R2 as a seed layer. The increase in height variation of the source/drain regions 130 may increase a variation in strain to be exerted to a channel region from the source/drain regions 130. This may lead to deterioration in channel property of the semiconductor device.

According to an example embodiment of the inventive concept, it is possible to reduce a variation in height of the top surface U2 of each of the second regions R2 of the active pattern AP. As a result, it is possible to reduce a variation in height of the source/drain regions 130, which are epitaxially grown using the top surface U2 of each of the second regions R2 as a seed layer. In other words, it is possible to reduce a variation in strain to be exerted to a channel region from the source/drain regions 130.

In addition, in the case where the source/drain regions 130 are formed using the both sidewalls of the second regions R2 as a seed layer, a width W of each of the source/drain regions 130 can be increased, compared with the case that only the top surface U2 of the second regions R2 is used as the seed layer. This makes is possible to reduce contact resistance between the source/drain regions 130 and contact plugs thereon.

Accordingly, it is possible to provide the semiconductor device with an increased channel property and an increased resistance property.

Figure 8A:
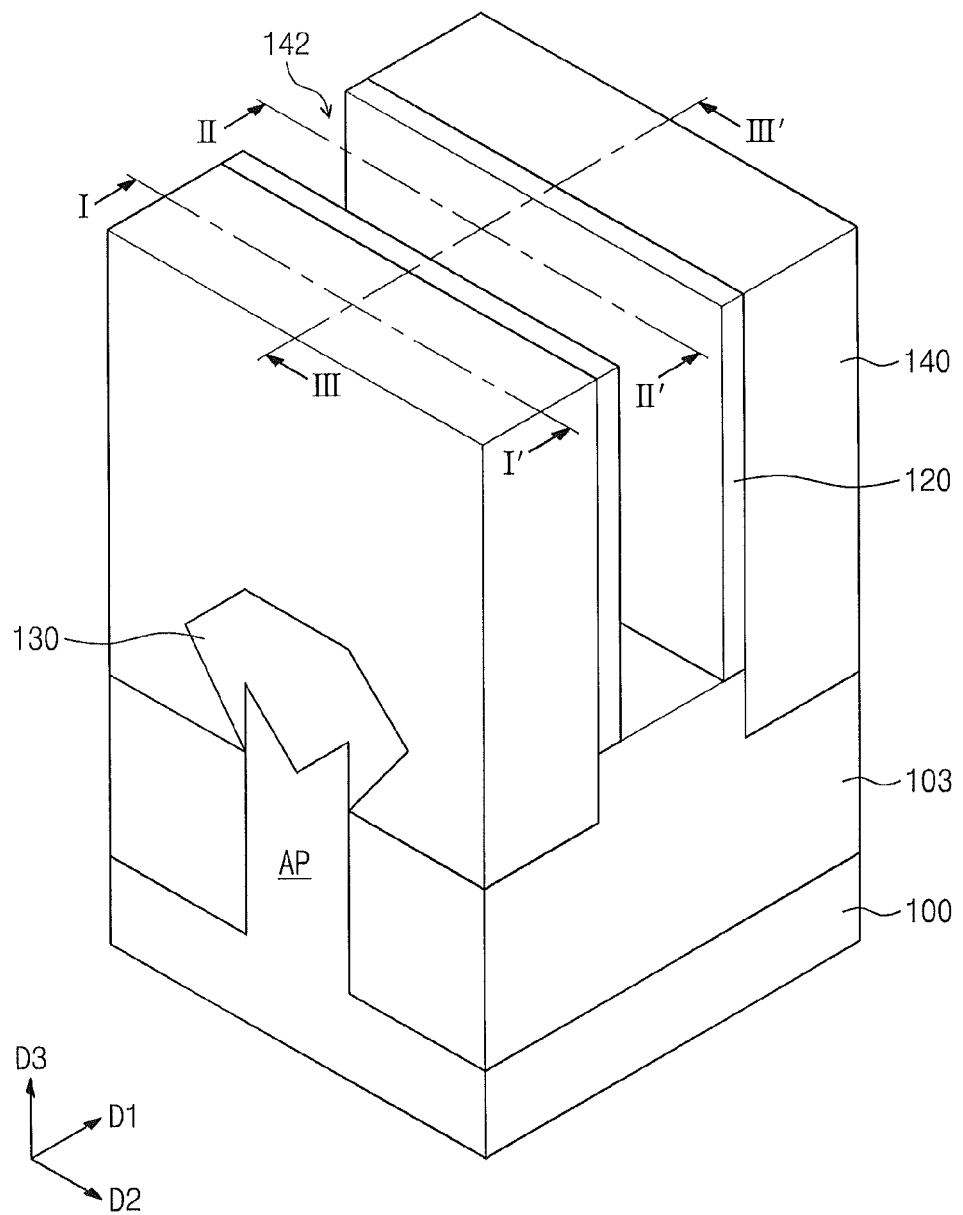

Referring to FIGS. 8A and 8B, a lower interlayer insulating layer 140 may be formed on the substrate 100 provided with the source/drain regions 130. The lower interlayer insulating layer 140 may be formed to cover the source/drain regions 130 and the sacrificial gate pattern 110. The lower interlayer insulating layer 140 may include at least one of a silicon oxide layer, a silicon nitride layer, a silicon oxynitride layer, or low-k dielectrics.

The lower interlayer insulating layer 140 may be etched to expose the top surface of the sacrificial gate pattern 110. During the etching process of the lower interlayer insulating layer 140, the gate mask pattern 113 may be removed. Thereafter, the sacrificial gate pattern 110 may be removed to form a gap region 142 exposing the first portion P1 of the active fin AF between the gate spacers 120. The formation of the gap region 142 may include etching the sacrificial gate pattern 110 using an etching process having an etch selectivity with respect to the gate spacers 120, the lower interlayer insulating layer 140, and the etch stop pattern 105. Further, the formation of the gap region 142 may include removing the etch stop pattern 105 to expose the first portion P1 of the active fin AF.

Referring back to FIGS. 1A and 1B, a gate dielectric pattern 144 and a gate electrode 150 may be formed to fill the gap region 142. For example, a gate dielectric layer (not shown) may be formed on the substrate 100 with the gap region 142 to fill a portion of the gap region 142. The gate dielectric layer may be formed to cover the first portion P1 of the active fin AF. The gate dielectric layer may include at least one of high-k dielectrics. For example, the gate dielectric layer may include at least one of hafnium oxide, hafnium silicate, zirconium oxide, or zirconium silicate, but an example embodiment of the inventive concept may not be limited to the materials. The gate dielectric layer may be formed by, for example, an atomic layer deposition process.

Thereafter, a gate layer (not shown) may be formed on the gate dielectric layer to fill the remaining portion of the gap region 142. The gate layer may include at least one of conductive metal nitrides (e.g., titanium nitride, tantalum nitride, and so forth) or metals (e.g., aluminum, tungsten, and so forth). A planarization process may be performed to the gate dielectric layer and the gate layer to form the gate dielectric pattern 144 and the gate electrode 150 in the gap region 142. The planarization process may be performed to expose the top surfaces of the lower interlayer insulating layer 140 and the gate spacer 120. The gate dielectric pattern 144 may extend along the bottom surface of the gate electrode 150 and may be provided on both sidewalls of the gate electrode 150 and between the gate electrode 150 and the gate spacer 120.

The first portion P1 of the active fin AF positioned below the gate electrode 150 may be used as a channel region CHR for a transistor. The channel region CHR may be interposed between the source/drain regions 130. The gate dielectric pattern 144, the gate electrode 150, and the gate spacer 120 may constitute a gate structure GS.

Although not shown, an upper interlayer insulating layer may be formed on the resulting structure with the gate electrode 150. Contact holes may be formed through the upper interlayer insulating layer and the lower interlayer insulating layer 140 to expose the source/drain regions 130, and contact plugs may be formed to fill the contact holes, respectively. Interconnection lines may be formed on the upper interlayer insulating layer and may be connected to the contact plugs. The interconnection lines may be connected to the source/drain regions 130 through the contact plugs.

Figure 9A:
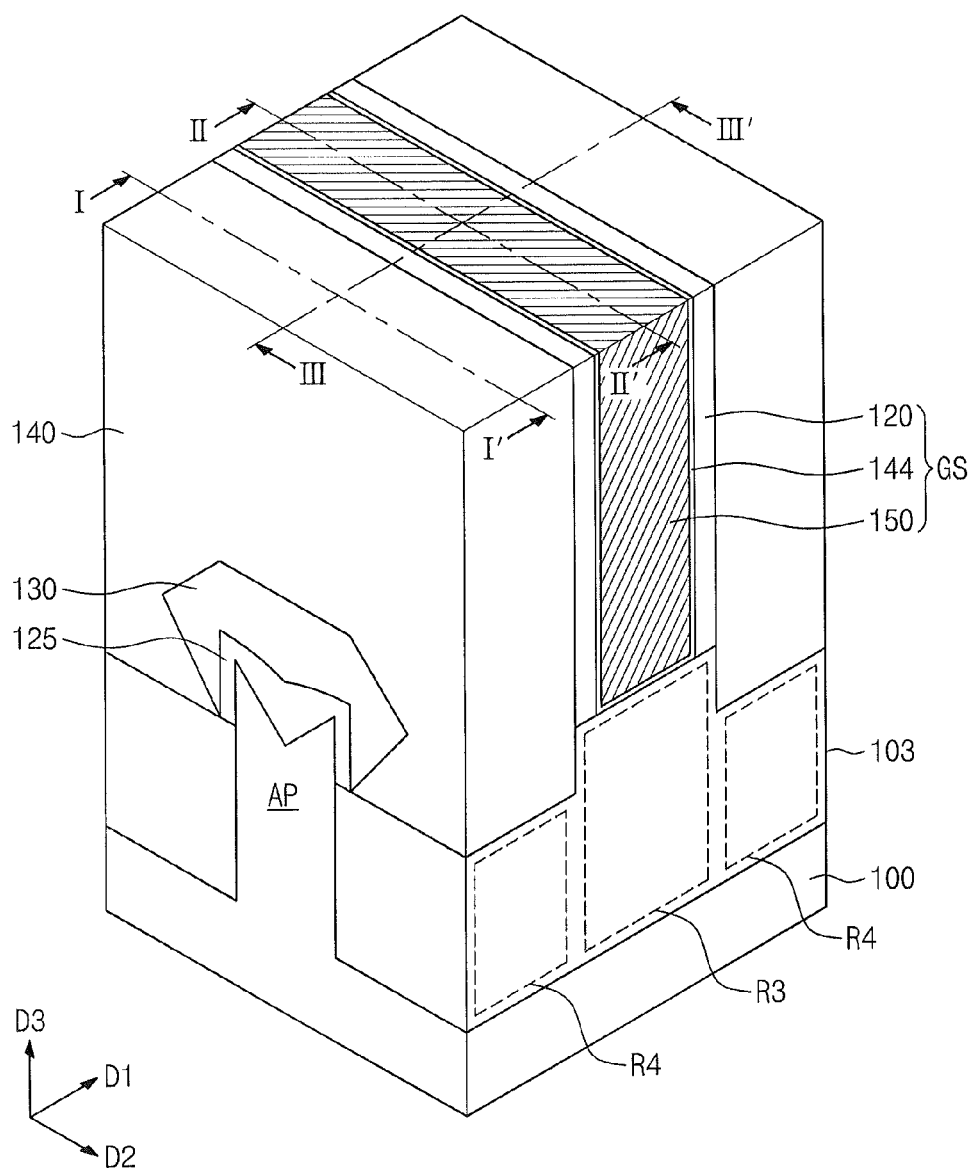
FIG. 9A is a perspective view illustrating a semiconductor device according to other example embodiment of the inventive concept.
Figure 9B:
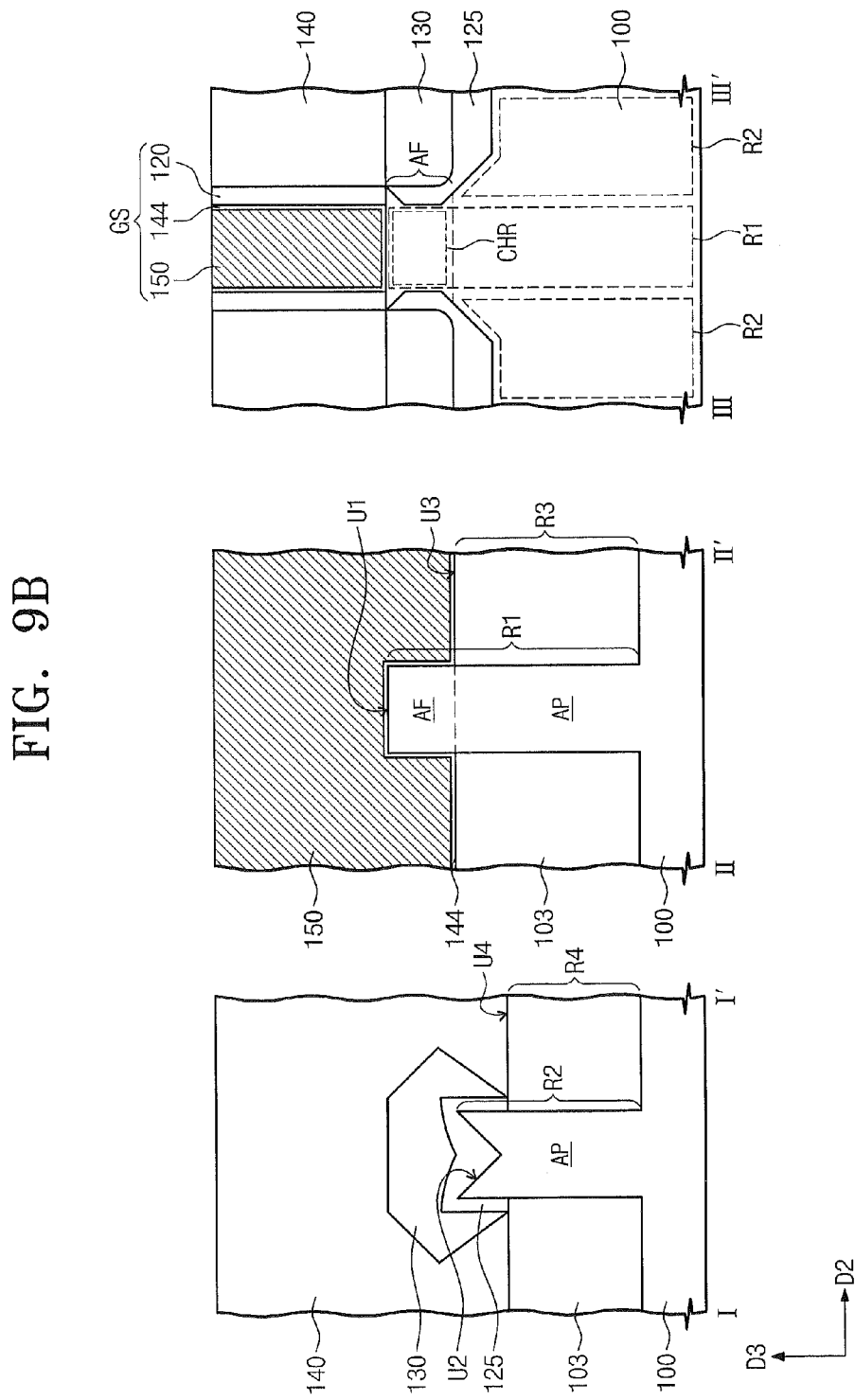
FIG. 9B shows cross sectional views taken along lines I-I', II-II', and III-III' of FIG. 9A.

FIG. 9A is a perspective view illustrating a semiconductor device according to other example embodiment of the inventive concept, and FIG. 9B shows sectional views taken along lines I-I', II-II', and III-III' of FIG. 9A. In the following description, an element previously described with reference to FIGS. 1A and 1B may be identified by a similar or identical reference number without repeating an overlapping description thereof, for the sake of brevity.

The gate structure GS may be disposed on the substrate 100 to cross the active pattern AP. The gate structure GS may cover partially both sidewalls of the active pattern AP. The active pattern AP may include the first region R1 below the gate structure GS and the second regions R2 on both, sides of the gate structure GS.

The device isolation patterns 103 may be provided at both sides of the active pattern AP. The upper portion of the first region R1 of the active pattern AP exposed by the device isolation patterns 103 will be used as the active fin AF. The active fin AF may include the channel region CHR. The device isolation patterns 103 may also expose the upper portion of each of the second regions R2 of the active pattern AP.

The top surface U2 of each of the second regions R2 of the active pattern AP may be lower than the top surface U1 of the first region R1 of the active pattern AP. When viewed in a sectional view, the top surface U2 of each of the second regions R2 may have the concave surface shape.

Each of the device isolation patterns 103 may include the third region R3 positioned below the gate structure GS and the fourth regions R4 positioned at both sides of the gate structure GS. The top surface U4 of each of the fourth regions R4 may be lower than the top surface U3 of the third region R3. Each of the second regions R2 of the active pattern AP may have the sidewalls exposed by the device isolation patterns 103.

The source/drain regions 130 may be provided at both sides of the gate structure GS. Each of the source/drain regions 130 may cover the top surface U2 of each of the second regions R2 and may cover the sidewalls of each of the second regions R2 exposed by the device isolation patterns 103.

In the present embodiment, buffer patterns 125 may be interposed between the second regions R2 of the active pattern AP and the source/drain regions 130. Each of the buffer patterns 125 may be an epitaxial pattern that is in contact with the top surface U2 of each of the second regions R2 and the sidewalls of each of the second regions R2 exposed by the device isolation patterns 10. According to the present embodiment, each of the source/drain regions 130 and the buffer patterns 125 may include germanium (Ge). The buffer patterns 125 may be formed to have a germanium concentration that is lower than that of the source/drain regions 130. For example, the germanium concentration of the buffer patterns 125 may be about 30 atomic percent (at. %) or lower.

In general, in the case that a germanium-containing layer (e.g., the source/drain regions 130) is epitaxially grown from a silicon seed layer (e.g., the substrate 100), a stress may be exerted at an interface between the germanium-containing layer and the silicon layer (e.g., between the substrate 100 and the source/drain regions 130), due to a difference in crystal structure between them.

According to the present embodiment, the buffer patterns 125, whose germanium concentration is lower than that of the source/drain regions 130, are interposed between the second regions R2 of the active pattern AP and the source/drain regions 130, and this makes it possible to reduce the stress at the interface between the second regions R2 of the active pattern AP and the source/drain regions 130.

Figure 10A:
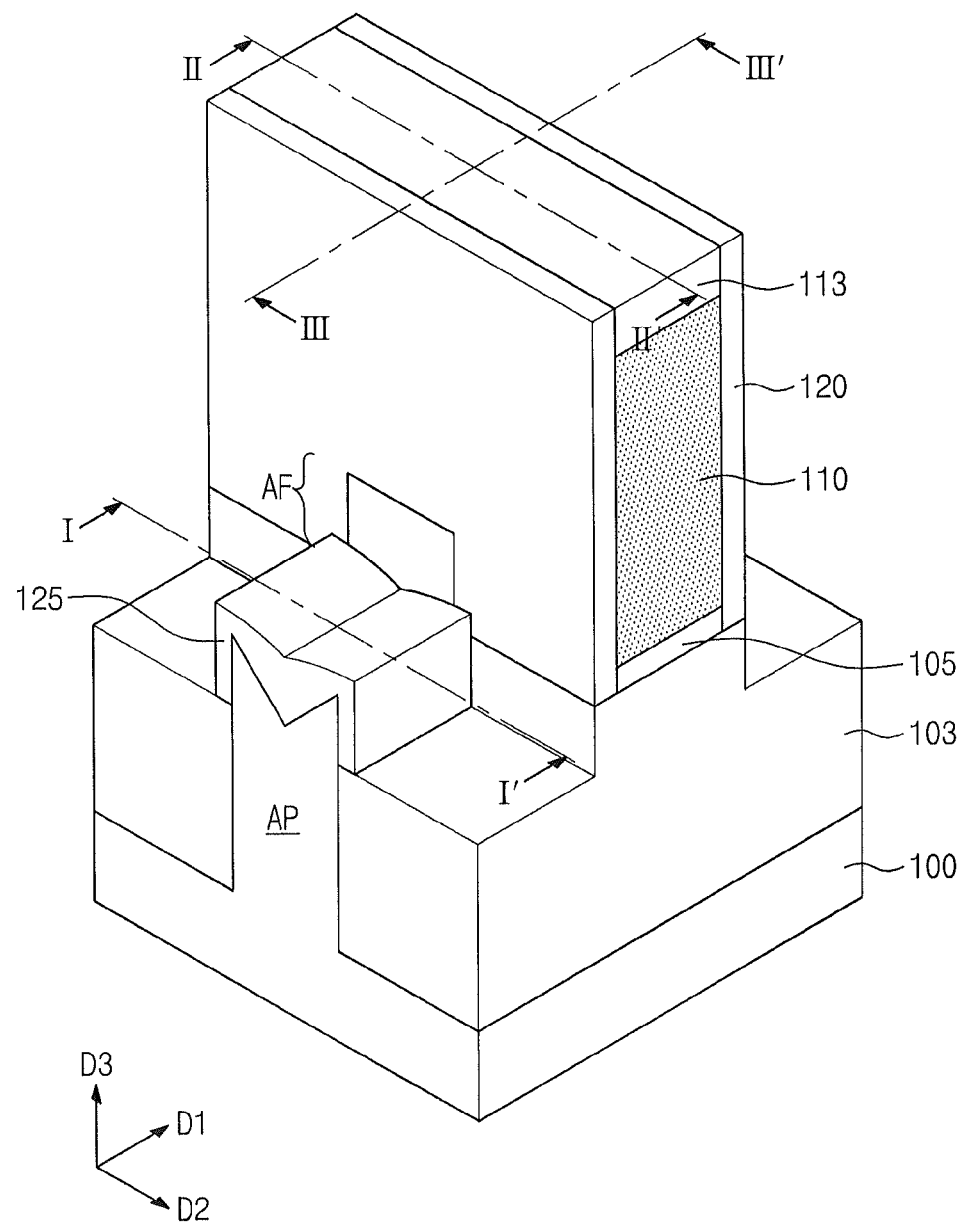
FIGS. 10A and 11A are perspective views illustrating processing steps in the fabrication of semiconductor device according to other example embodiment of the inventive concept.
Figure 10B:
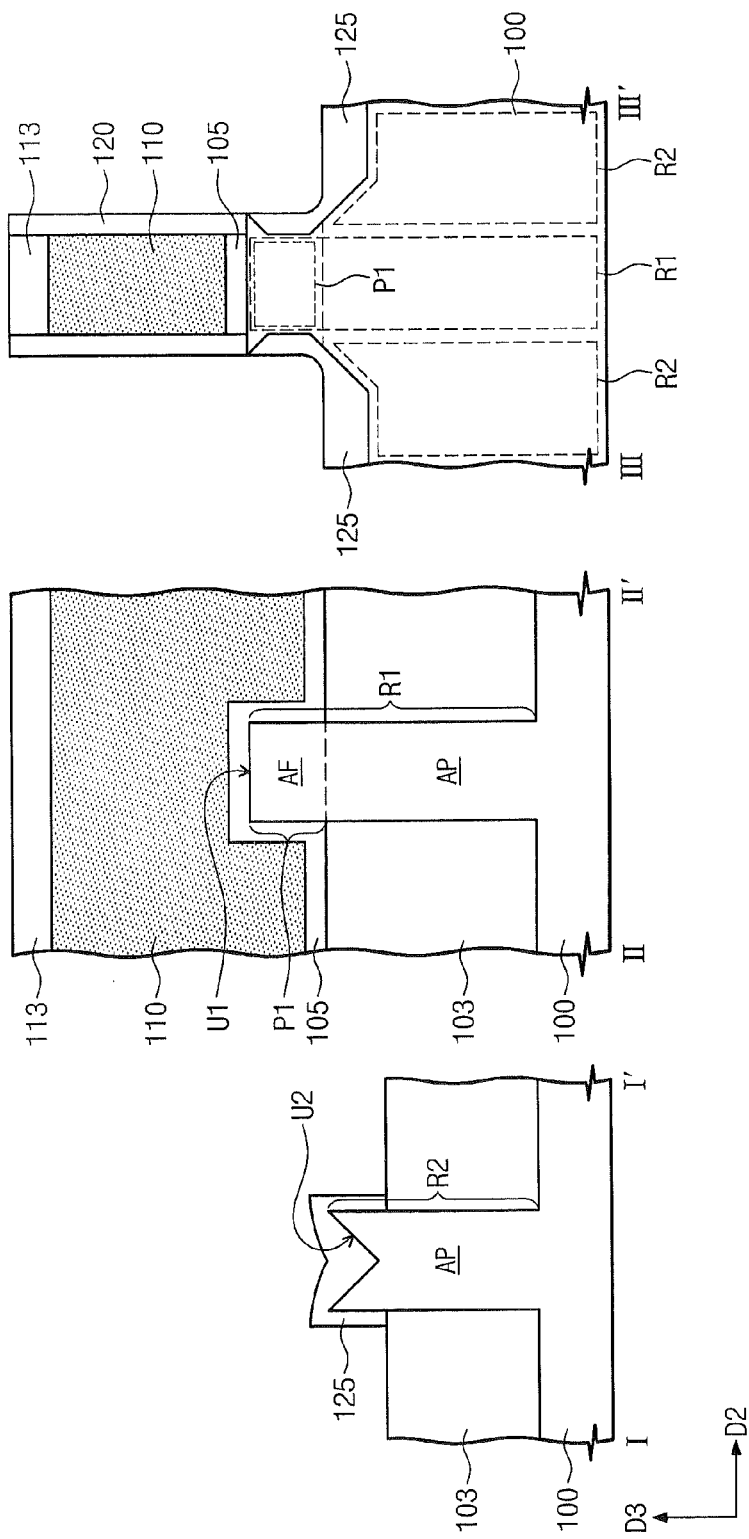
FIGS. 10B and 11B are cross sectional views taken along I-I', of FIGS. 10A and 11A, respectively.
Figure 11A:
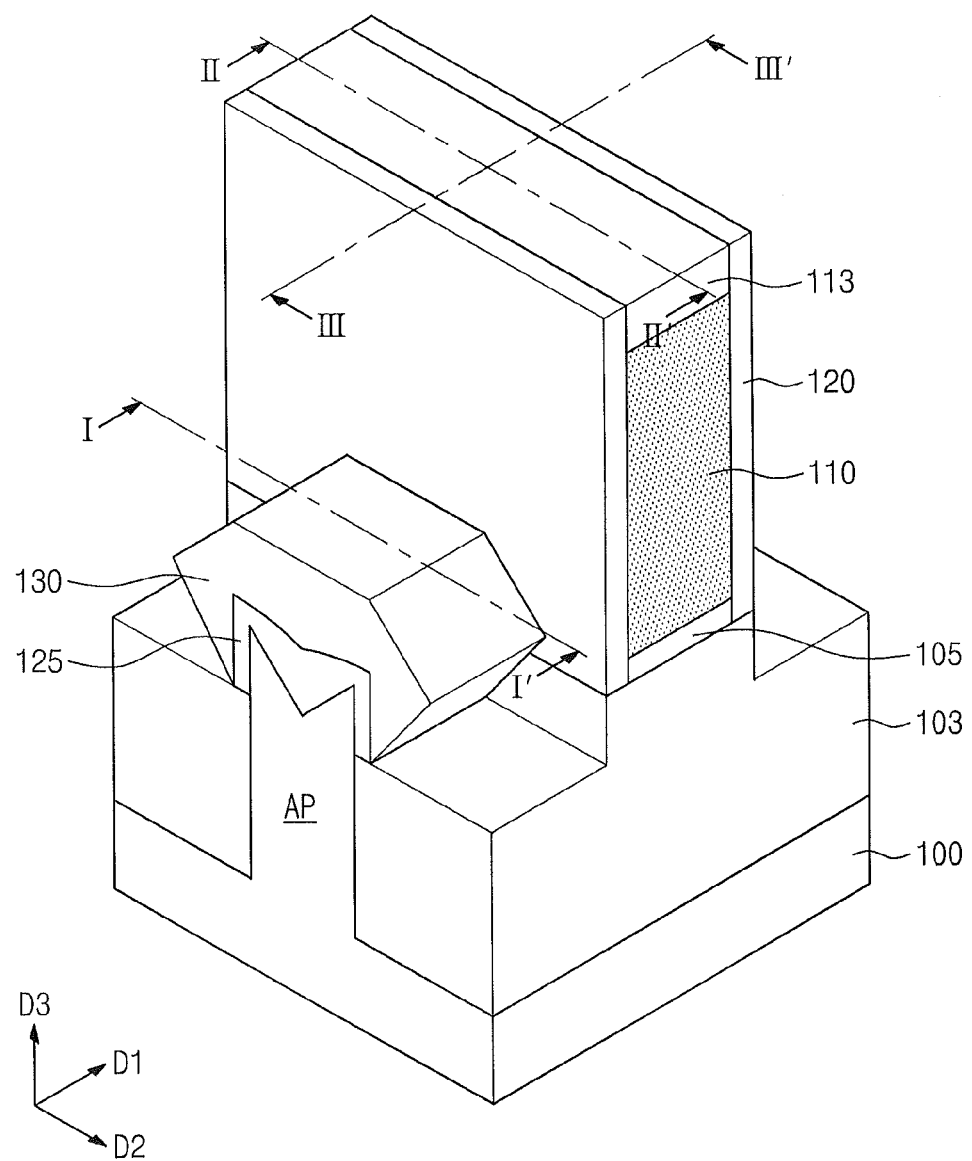
Figure 11B:
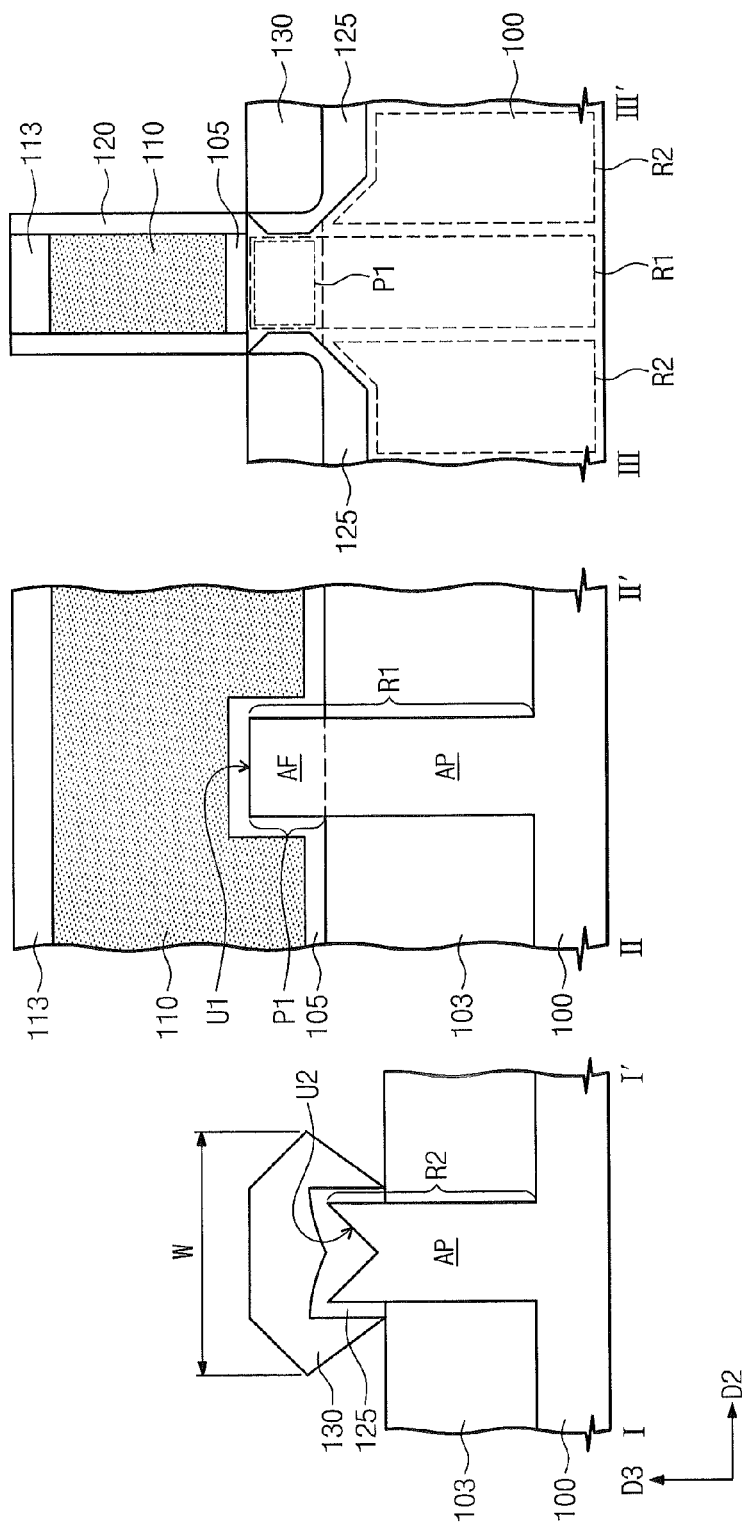

FIGS. 10A and 11A are perspective views illustrating a method of fabricating a semiconductor device according to other example embodiment of the inventive concept, and FIGS. 10B and 11B are sectional views taken along I-I', II-II', and III-III' of FIGS. 10A and 11A, respectively. In the following description of the fabrication method, an element previously described with reference to FIGS. 2A through 8A and 2B through 8B may be identified by a similar or identical reference number without repeating an overlapping description thereof, for the sake of brevity.

As described with reference to FIGS. 2A through 6A and FIGS. 2B through 6B, the substrate 100 may be patterned to form the active pattern AP extending along the first direction D1. The device isolation patterns 103 may be formed at both sides of the active pattern AP, and then the top surface of the device isolation patterns 103 may be recessed to expose the upper portion of the active pattern AP. The upper portion of the active pattern AP exposed by the device isolation patterns 103 may serve as the active fin AF.

The sacrificial gate pattern 110 may be formed on the substrate 100 to cross the active fin AF. The active fin AF may include the first portion P1 and the second portions P2, which are defined by the sacrificial gate pattern 110 crossing the active fin AF. The first portion P1 may be a portion of the active fin AF that is positioned below the sacrificial gate pattern 110 and is overlapped with the sacrificial gate pattern 110. The second portions P2 may be two portions of the active fin AF that are positioned at both sides of the sacrificial gate pattern 110 and are horizontally separated by the first portion P1.

In addition, since the sacrificial gate pattern 110 is formed to cross the active fin AF, the first region R1 and the second regions R2 may be defined in the active pattern AP. The first region R1 may be a portion of the active pattern AP that is positioned below the sacrificial gate pattern 110 and is overlapped with the sacrificial gate pattern 110. The second regions R2 may be two portions of the active pattern AP that are positioned at both sides of the sacrificial gate pattern 110 and are horizontally separated from each other by the first region R1.

The first portion P1 of the active fin AF may be the upper portion of the first region R1 of the active pattern AP, and the second portions P2 of the active fin AF may be the upper portions of the second regions R2, respectively, of the active pattern AP.

After the formation of the sacrificial gate pattern 110, the etch stop layer may be removed from both sides of the sacrificial gate pattern 110 to form an etch stop pattern 105 below the sacrificial gate pattern 110, and then, the gate spacer 120 may be formed on both sidewalls of the sacrificial gate pattern 110.

The second portions P2 of the active fin AF may be removed. Accordingly, the top surface U2 of each of the second regions R2 of the active pattern AP may be lower than the top surface U1 of the first region R1 of the active pattern AP.

After the removal of the second portions P2 of the active fin AF, the upper portion of each of the second regions R2 of the active pattern AP may be etched to form a concave region Co. For example, when viewed in a sectional view, the top surface U2 of each of the second regions R2 may be formed to have a concave surface shape.

The upper portions of the device isolation patterns 103 may be recessed to partially expose both sidewalls of each of the second regions R2 of the active pattern AP.

Referring to FIGS. 10A and 10B, the buffer patterns 125 may be formed at both sides of the sacrificial gate pattern 110. The buffer patterns 125 may be formed on the second regions R2 of the active pattern AP. Each of the buffer patterns 125 may be formed to cover the top surface U2 and the both sidewalls of each of the second regions R2.

The formation of the formation of the buffer patterns 125 may include performing a selective epitaxial growth process to the substrate 100. For example, each of the buffer patterns 125 may be an epitaxial pattern, which may be grown using the top surface U2 and the both sidewalls of each of the second regions R2 of the active pattern AP as a seed layer.

In an example embodiment, the buffer patterns 125 may include a silicon-germanium (SiGe) layer epitaxially grown from the substrate 100, and the germanium concentration of the buffer patterns 125 may be about 30 at. % or lower. The buffer patterns 125 may be formed to fill at least a portion of the concave region Co.

Referring to FIGS. 11A and 11B, the source/drain regions 130 may be formed on the buffer patterns 125. Each of the source/drain regions 130 may cover the top surface U2 of each of the second regions R2 of the active pattern AP and may extend along the both sidewalls of each of the second regions R2 to partially cover the both sidewalls of each of the second regions R2. In other words, the buffer patterns 125 may be interposed between the source/drain regions 130 and the second regions R2.

The formation of the source/drain regions 130 may include performing a selective epitaxial growth process to the substrate 100. In other words, each of the source/drain regions 130 may be an epitaxial pattern grown from the buffer patterns 125 serving as a seed layer. According to the present embodiment, the source/drain regions 130 and the buffer patterns 125 may be sequentially or successively formed using the selective epitaxial growth process. In an example embodiment, each of the source/drain regions 130 may include a silicon-germanium (SiGe) layer that is epitaxially grown from the buffer patterns 125 serving as a seed layer. The source/drain regions 130 may be formed to have a germanium concentration that is higher than that of the buffer patterns 125.

According to the present embodiment, since the buffer pattern 125 is formed on each of the second regions R2 of the active pattern AP, it is possible to increase the width W of the source/drain regions 130 grown from the buffer patterns 125 using the seed layer. This makes is possible to reduce contact resistance between the source/drain regions 130 and contact plugs thereon. The subsequent processes may be performed in the same manner as those of the fabrication method described with reference to FIGS. 1A, 1B, 8A, and 8B.

According to an example embodiment of the inventive concept, it is possible to reduce a variation in height of the top surface U2 of each of the second regions R2 of the active pattern AP. As a result, it is possible to reduce a variation in height of the source/drain regions 130, which are epitaxially grown using the top surface U2 of each of the second regions R2 as a seed layer. In other words, it is possible to reduce a variation in strain to be exerted to a channel region from the source/drain regions 130.

In addition, since the source/drain regions 130 are formed to cover the both sidewalls of the second regions R2, the width W of each of the source/drain regions 130 can be increased, compared with the case that the source/drain regions 130 are formed to cover only the top surface U2 of the second regions R2. This makes is possible to reduce contact resistance between the source/drain regions 130 and contact plugs thereon.

As a result, it is possible to provide a semiconductor device with an increased channel property and an increased resistance property.

Figure 15:
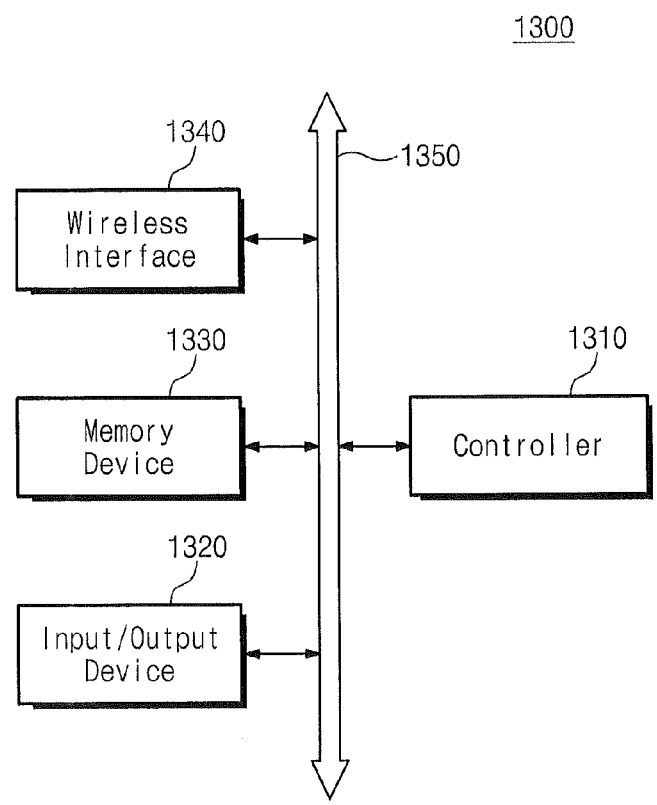
FIGS. 15 and 16 are block diagrams illustrating examples of electronic devices including a semiconductor device according to an example embodiment of the inventive concept.
Figure 16:
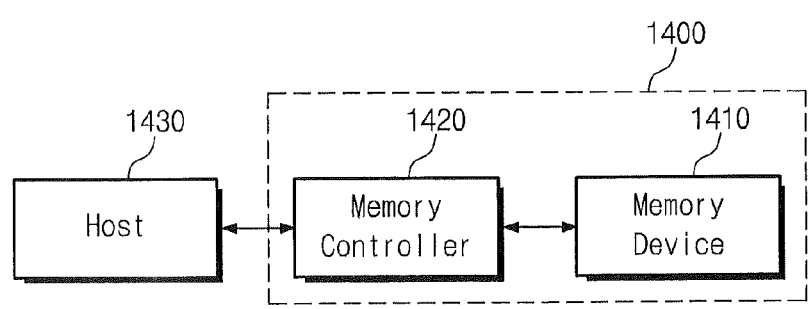

FIGS. 15 and 16 are block diagrams illustrating examples of electronic devices including a semiconductor device according to an example embodiment of the inventive concept.

Referring to FIG. 15, an electronic device 1300 including a semiconductor device according to an example embodiment of the inventive concept may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory device 1330, and a wireless interface 1340 that are combined to each other through a bus 1350. The controller 1310 may include, for example, at least one microprocessor, a digital signal process, a microcontroller or the like. The memory device 1330 may be configured to store a command code to be used by the controller 1310 or a user data. The memory device 1330 may include a semiconductor device according to an example embodiment of the inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 16, a memory system including a semiconductor device according to an example embodiment of the inventive concept will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to an example embodiment of the inventive concept.

The semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above an example embodiment is mounted may further include at least one semiconductor device (e.g., a controller and/or a logic device) that controls the semiconductor memory device.

According to an example embodiment of the inventive concept, it is possible to reduce a variation in height of the top surface U2 of each of the second regions R2 of the active pattern AP, and thus, this makes it possible to reduce a variation in height of the source/drain regions 130, which are epitaxially grown using the top surface U2 of each of the second regions R2 as a seed layer. As a result, it is possible to reduce a variation in strain to be exerted to a channel region from the source/drain regions 130.

In addition, since the source/drain regions 130 are formed to cover the both sidewalls of the second regions R2, the width W of each of the source/drain regions 130 can be increased. This makes is possible to reduce contact resistance between the source/drain regions 130 and contact plugs thereon.

Accordingly, it is possible to provide the semiconductor device with an increased channel property and an increased resistance property.

While an example embodiment of the inventive concepts have been particularly shown and described, it will be understood by one of ordinary skill in the art that variations in form and detail may be made therein without departing from the spirit and scope of the attached claims.

What is claimed is:
1. A semiconductor device, comprising:
a substrate provided with an active pattern;

a device isolation pattern provided on the substrate to cover a portion of a sidewall of the active pattern;

a gate structure provided on the active pattern to cross the active pattern;

source/drain regions provided at both sides of the gate structure, wherein the active pattern comprises a first region below the gate structure and second regions disposed at both sides of the gate structure;

wherein a top surface of each of the second regions is lower than that of the first region;

wherein the source/drain regions are provided on the second regions, respectively;

wherein each of the source/drain regions covers partially both sidewalls of each of the second regions; and wherein the device isolation pattern comprises:

a third region below the gate structure; and fourth regions at both sides of the gate structure, wherein a top surface of each of the fourth regions is lower than that of the third region; and wherein a top end of each of the second regions is substantially at a same level as a top surface of the third region.

2. The device of claim 1, wherein the top surface of each of the second regions has two opposite surfaces inclined in a symmetric manner, when viewed in a sectional view.

3. The device of claim 1:

wherein the substrate comprises a single crystalline semiconductor material; and wherein the top surface of each of the second regions is a specific crystal plane of the single crystalline semiconductor material.

4. The device of claim 1, wherein each of the source/drain regions is an epitaxial pattern that is in electrical contact with the top surface and both sidewalls of each of the second regions.

5. The device of claim 1:

wherein each of the source/drain regions and buffer patterns between the source/drain regions comprises a germanium-containing material; and wherein the buffer patterns have a germanium concentration that is lower than that of the source/drain regions.

6. The device of claim 1, further comprising:

buffer patterns between the source/drain regions and the second regions, wherein each of the buffer patterns is an epitaxial pattern that is in contact with the top surface and both sidewalls of each of the second regions;

wherein the top surface of each of the second regions has a V-shaped surface, when viewed in a sectional view; and wherein the buffer patterns extend on the V-shaped surface and down the sidewalls of the active pattern.

7. The device of claim 6, wherein each of the buffer patterns is thicker at a center of each of the second regions than at an edge of each of the second regions.

8. The device of claim 6, wherein each of the buffer patterns is thicker at the top surface of each of the second regions than at both sidewalls of each of the second regions.

9. A semiconductor device, comprising:

a substrate;

an active pattern protruding from the substrate in a direction substantially perpendicular to an upper surface of the substrate;

a gate structure provided on the substrate to cross the active pattern, wherein the active pattern comprises a first region below the gate structure and second regions at both sides of the gate structure; and wherein a top surface of each of the second regions has a V-shaped surface, when viewed in a sectional view;

source/drain regions provided on the second regions of the active pattern, respectively;

buffer patterns between the source/drain regions and the second regions, wherein each of the buffer patterns is an epitaxial pattern that is in contact with the top surface and both sidewalls of each of the second regions;

wherein the buffer patterns extend on the V-shaped surface and down the sidewalls of the active pattern;

wherein each of the buffer patterns is thicker at a center of each of the second regions than at an edge of each of the second regions; and wherein each of the buffer patterns is thicker at the top surface of each of the second regions than at both sidewalls of each of the second regions; and a device isolation pattern provided on the substrate to cover a portion of a sidewall of the active pattern, wherein the device isolation pattern comprises:

a third region disposed below the gate structure; and fourth regions disposed at both sides of the gate structure;

wherein a top surface of each of the fourth regions is lower than that of the third region; and wherein a top end of each of the second regions is substantially at a same level as a top surface of the third region.

10. The device of claim 9, wherein the top surface of each of the second regions has two opposite surfaces inclined in a symmetric manner, when viewed in a sectional view.

11. The device of claim 10:

wherein the substrate is a single crystalline silicon wafer; and wherein the top surface of each of the second regions has a (111) plane of the single crystalline silicon wafer.

12. The device of claim 9, wherein the top surface of each of the second regions is lower than a top surface of the first region.

13. The device of claim 12, wherein the top surface of the first region is higher than that of the third region.

14. The device of claim 9, wherein each of the source/drain regions and the buffer patterns comprises a germanium-containing material; and wherein the buffer patterns have a germanium concentration that is lower than that of the source/drain regions.

15. A semiconductor device, comprising:

a substrate;

an active pattern protruding from the substrate, the active pattern extending in a first direction parallel to an upper surface of the substrate;

device isolation patterns provided at both sides of the active pattern, the device isolation patterns extending in the first direction, a portion of the active pattern protruding above a surface of the device isolation pattern and being free of the device isolation pattern;

a gate structure provided on the active pattern to extend in a second direction parallel to the upper surface of the substrate and crossing the first direction, wherein the active pattern comprises a first region below the gate structure and second regions at both sides of the gate structure;

wherein a top surface of each of the second regions is lower than that of the first region;

wherein each of the device isolation patterns comprises a third region disposed below the gate structure and fourth regions disposed at both sides of the gate structure;

wherein a top end of each of the second regions is substantially at a same level as a top surface of the third region;

wherein a top surface of each of the fourth regions is lower than that of the third region;

source/drain regions provided on the second regions of the active patterns, respectively, and buffer patterns between the source/drain regions and the second regions, wherein each of the buffer patterns is an epitaxial pattern that is in contact with the top surface and both sidewalls of each of the second regions;

wherein the top surface of each of the second regions has a V-shaped surface, when viewed in a sectional view; and wherein the buffer patterns extend on the V-shaped surface and down both sidewalls of the active pattern.

16. The device of claim 15, wherein each of the buffer patterns is thicker at a center of each of the second regions than at an edge of each of the second regions.

17. The device of claim 15, wherein each of the buffer patterns is thicker at the top surface of each of the second regions than at both sidewalls of each of the second regions.

* * * * *